(12) United States Patent
Hosono et al.

(10) Patent No.: US 9,368,739 B2
(45) Date of Patent: Jun. 14, 2016

(54) ORGANIC ELECTROLUMINESCENCE ELEMENT

(71) Applicants: TOKYO INSTITUTE OF TECHNOLOGY, Meguro-ku (JP); ASAHI GLASS COMPANY, LIMITED, Chiyoda-ku (JP)

(72) Inventors: Hideo Hosono, Meguro-ku (JP); Yoshitake Toda, Meguro-ku (JP); Setsuro Ito, Meguro-ku (JP); Satoru Watanabe, Chiyoda-ku (JP); Naomichi Miyakawa, Chiyoda-ku (JP); Kazuhiro Ito, Chiyoda-ku (JP); Toshinari Watanabe, Chiyoda-ku (JP)

(73) Assignees: TOKYO INSTITUTE OF TECHNOLOGY, Merguro-ku (JP); Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 14/566,755

(22) Filed: Dec. 11, 2014

(65) Prior Publication Data
US 2015/0137103 A1    May 21, 2015

Related U.S. Application Data

(63) Continuation of application No. PCT/JP2013/066852, filed on Jun. 19, 2013.

(30) Foreign Application Priority Data

Jun. 20, 2012 (JP) ................................. 2012-139197
Jul. 11, 2012 (JP) ................................. 2012-155830
Sep. 28, 2012 (JP) ................................. 2012-217351
Dec. 7, 2012 (JP) ................................. 2012-267752
Feb. 27, 2013 (JP) ................................. 2013-037852
Mar. 29, 2013 (JP) ................................. 2013-071154

(51) Int. Cl.
*H01L 33/00* (2010.01)
*H01L 31/0328* (2006.01)
(Continued)

(52) U.S. Cl.
CPC ........ *H01L 51/5012* (2013.01); *H01L 51/5072* (2013.01); *H01L 51/5092* (2013.01); *H01L 51/56* (2013.01); *H01B 1/08* (2013.01)

(58) Field of Classification Search
CPC ............ H01L 51/5012; H01L 51/5092; H01L 51/5072; H01L 51/56
USPC ............. 257/40, 79, 80, 83, 84, 87, 184, 222, 257/290; 438/22–29, 34, 48, 57, 99
See application file for complete search history.

(56) References Cited

U.S. PATENT DOCUMENTS

2006/0151311 A1    7/2006 Hosono et al.
2009/0045438 A1*   2/2009 Inoue et al. .................... 257/192
(Continued)

FOREIGN PATENT DOCUMENTS

CN    102459082 A    5/2012
JP    05-41285        2/1993
(Continued)

OTHER PUBLICATIONS

Kim et al, Fabrication of room temperature—stable 12CaO.7Al2O3 electride: a review, J. Mater. Sci: Mater Electron (2007) 18:S5-S14.*
(Continued)

*Primary Examiner* — Hsien Ming Lee
(74) *Attorney, Agent, or Firm* — Oblon, McClelland, Maier & Neustadt, L.L.P.

(57) ABSTRACT

A light emitting device including an organic electroluminescence element is provided. The light emitting device may be a display device or a lighting device. The organic electroluminescence element includes an anode, a light emitting layer, and a cathode that are arranged in this order. An electron injection layer is arranged between the light emitting layer and the cathode. The electron injection layer is made of an amorphous C12A7 electride.

11 Claims, 12 Drawing Sheets

(51) Int. Cl.
   *H01L 29/74* (2006.01)
   *H01L 21/00* (2006.01)
   *H01L 51/50* (2006.01)
   *H01L 51/56* (2006.01)
   *H01B 1/08* (2006.01)

(56) References Cited

U.S. PATENT DOCUMENTS

2009/0218570 A1* 9/2009 Ha et al. .......................... 257/59
2009/0314991 A1* 12/2009 Cho et al. ................. 252/301.36

FOREIGN PATENT DOCUMENTS

| JP | 11-102787 | 4/1999 |
| JP | 2006-134691 | 5/2006 |
| JP | 2008-195583 A | 8/2008 |
| JP | 2010-45228 | 2/2010 |
| WO | WO 2005/000741 | 1/2005 |
| WO | WO 2012/056674 | 5/2012 |

OTHER PUBLICATIONS

U.S. Appl. No. 14/567,047, filed Dec. 11, 2014, Hosono, et al.
F.M. Lea and C.H. Desch, The Chemistry of Cement and Concrete, $2^{nd}$ Ed., p. 52, Edward Arnold & Co., London, 1956.
O. Yamaguchi et al. "New Compound in the System SrO—$Al_2O_3$", J. Am. Ceram. Soc. 1986, 69, C-36.
International Search Report issued in PCT/JP2013/066852, dated Aug. 6, 2013.
Supplementary European Search Report issued in corresponding EP patent application No. 13806570.
Kim et al.—"Solvated Electrons in High-Temperature Melts and Glasses of the Room-Temperature Stable Electride $[Ca_{24}Al_{28}O_{64}]_{4+}$·4e-" Science vol. 333, pp. 71-74, Jul. 1, 2011.
Tai et al.-"Electrical and optical properties of $12CaO \cdot 7Al_2O_3$ electride doped indium tin oxide thin film deposited by RF magnetron co-sputtering", Thin Solid Films 517 (2009), pp. 6294-6297.

\* cited by examiner

ORGANIC ELECTROLUMINESCENCE ELEMENT

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2013/066852 filed on Jun. 19, 2013 and designating the U.S., which claims priority to Japanese Patent Application No. 2012-139197 filed on Jun. 20, 2012, Japanese Patent Application No. 2012-155830 filed on Jul. 11, 2012, Japanese Patent Application No. 2012-217351 filed on Sep. 28, 2012, Japanese Patent Application No. 2012-267752 filed on Dec. 7, 2012, Japanese Patent Application No. 2013-037852 filed on Feb. 27, 2013, and Japanese Patent Application No. 2013-071154 filed on Mar. 29, 2013. The entire contents of the foregoing applications are incorporated herein by reference.

BACKGROUND OF THE INVENTION

1. Field of the Invention

The present invention relates to an organic electroluminescence element.

2. Description of the Related Art

Organic electroluminescence elements are widely used in displays, backlights, and lighting applications, for example.

In general, an organic electroluminescence (EL) element includes an anode, a cathode, and an organic light emitting layer arranged between these electrodes. When a voltage is applied between the electrodes, holes and electrons are injected into the organic light emitting layer from the electrodes. When the electrons and the holes are recombined in the organic light emitting layer, binding energy is generated, and the organic luminescent material within the organic light emitting layer is excited by the binding energy. Light is emitted when the luminescent material returns to the ground state from the excited state, and such a mechanism is used to obtain a light emitting element.

Typically, the organic EL element further includes a hole injection layer and/or hole transport layer, and an electron injection layer and/or electron transport layer. The hole injection layer and/or hole transport layer is arranged between the anode and the organic light emitting layer and is configured to selectively inject holes into the organic light emitting layer. The electron injection layer and/or electron transport layer is arranged between the cathode and the organic light emitting layer and is configured to selectively inject electrons into the organic light emitting layer. Thus, by arranging these layers in the organic EL element, light emitting efficiency of the organic EL element may be improved (see e.g. Japanese Laid-Open Patent Publication No. 11-102787).

In the organic EL element as described above, a material such as lithium fluoride (LiF) is typically used in the electron injection layer.

However, because lithium fluoride is an insulating material, when this material is used in the electron injection layer of an organic EL element, the layer thickness has to be extremely thin (e.g. 0.1 nm to 0.4 nm). Forming such a thin film is often quite difficult. For example, when the film thickness is too thin, it may be difficult to obtain a layered thin film. On the other hand, when the film thickness to too thick, an electron injection layer with adequate conductivity may not be obtained.

Also, lithium fluoride is relatively unstable and is prone to degradation upon coming into contact with the atmosphere. Thus, an electron injection layer made of lithium fluoride needs to be handled under a controlled environment, and as a result, the fabrication process thereof may be complicated.

Further, when the electron injection layer fails to achieve adequate conductivity or is degraded due to the above characteristics of lithium fluoride, desired light emitting characteristics may not be obtained in the organic EL element, or the reliability of the organic EL element may be degraded.

In view of the above, an aspect of the present invention relates to providing an organic electroluminescence element with improved stability and reliability.

SUMMARY OF THE INVENTION

According to an embodiment of the present invention, a light emitting device including an organic electroluminescence element is provided. The light emitting device may be a display device or a lighting device. The organic electroluminescence element includes an anode, a light emitting layer, and a cathode that are arranged in this order. An electron injection layer is arranged between the light emitting layer and the cathode. The electron injection layer is made of an amorphous C12A7 electride.

According to another embodiment of the present invention, a method of fabricating a light emitting device including an organic electroluminescence element is provided. The light emitting device may be a display device or a lighting device. The organic electroluminescence element includes an anode, a light emitting layer, and a cathode that are arranged in this order, and an electron injection layer is arranged between the light emitting layer and the cathode. The method involves forming an electron injection layer made of an amorphous electride thin film by sputtering under an atmosphere with an oxygen partial pressure of less than 0.1 Pa using a target made of a crystalline C12A7 electride having an electron density within a range of $2.0 \times 10^{18}$ cm$^{-3}$ to $2.3 \times 10^{21}$ cm$^{-3}$, the target having a diameter greater than or equal to 3 inches.

According to another embodiment of the present invention, a light emitting device including an organic electroluminescence element is provided. The light emitting device may be a display device or a lighting device. The organic electroluminescence element includes an anode, a light emitting layer, and a cathode that are arranged in this order. An electron injection layer is arranged between the light emitting layer and the cathode. The electron injection layer is made of an electride of an amorphous solid material including calcium, aluminum, and oxygen.

DESCRIPTION OF THE PREFERRED EMBODIMENTS

In the following, embodiments of the present invention are described with reference to the accompanying drawings.

(Organic Electroluminescence Element of Present Invention)

Figure 1:
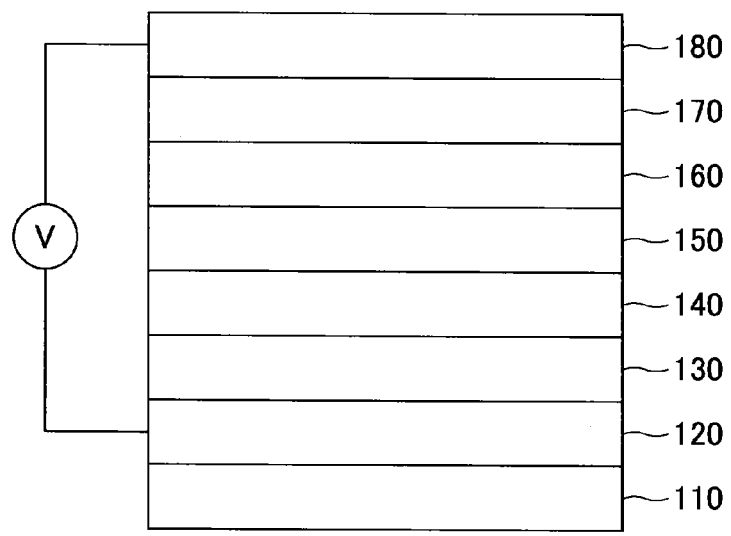
FIG. 1 is a schematic cross-sectional view of an organic electroluminescence element according to an embodiment of the present invention.

FIG. 1 is a schematic cross-sectional view of an organic electroluminescence element (hereinafter referred to as "organic EL element") according to an embodiment of the present invention.

As illustrated in FIG. 1, an organic EL element 100 according to an embodiment of the present invention includes a substrate 110, an anode 120, a hole injection layer 130, a hole transport layer 140, a light emitting layer 150, an electron-transport layer 160, an electron injection layer 170, and a cathode 180 that are stacked in this order.

Note, however, that in some embodiments, the hole injection layer 130, the hole transport layer 140, and/or the electron transport layer 160 may be omitted.

The substrate 110 is configured to support the other layers constituting the organic EL element 100 arranged on the substrate 110.

Note that in FIG. 1, if a light extraction face of the organic EL element 100 is arranged to be at the bottom side (i.e., substrate 110 side), the substrate 110 and the anode 120 are be made of transparent materials. For example, a glass substrate or a plastic substrate may be used as the substrate 110, and a thin film made of a transparent metal oxide such as ITO (indium tin oxide) may be used as the anode 120.

Note that operating principles of an organic EL element are well known to those skilled in the art, and the operating principles of the organic EL element 100 according to the present invention may basically be the same as those that are publicly known. Accordingly, descriptions of the operating principles of the organic EL element 100 are hereby omitted.

In the organic EL element 100 according to the present embodiment, the electron injection layer 170 is made of an amorphous C12A7 electride thin film.

As described in detail below, an amorphous C12A7 electride that is used as the electron injection layer 170 of the organic EL element 100 in the present embodiment exhibits good electrical conductivity. Thus, by using the amorphous C12A7 electride as the electron injection layer 170, it may be unnecessary to reduce the layer thickness of the electron injection layer 170 to an order of magnitude smaller than the nm order as in the case of using an electron injection layer made of lithium fluoride.

Also, the amorphous C12A7 electride is a stable ceramic material that is not prone to alteration or degradation even when it comes into contact with the atmosphere. Thus, by using the amorphous C12A7 electride as the electron injection layer 170, it may be unnecessary to handle the electron injection layer 170 under a controlled environment as in the case of using an electron injection layer made of lithium fluoride.

Further, the amorphous C12A7 electride has a low work function. Accordingly, in the present embodiment, an electron injection barrier to the light emitting layer 150 from the cathode 180 may be reduced, and light emitting efficiency of the organic EL element may be improved as a result.

Also, the amorphous C12A7 electride has a large ionization potential. As such, the amorphous C12A7 electride has the so-called hole blocking effect. That is, the amorphous C12A7 electride can prevent holes that were not recombined with electrons at the light emitting layer 150 from passing through the electron transport layer 160 and reaching the cathode 180 to thereby increase the probability of the electrons and holes being recombined. Thus, in the present embodiment, the light emitting efficiency of the organic EL element may be improved.

As described above, in the present embodiment, an amorphous C12A7 electride is used as the electron injection layer 170. According to an aspect of the present embodiment, problems encountered in a conventional organic El element such as a decrease in reliability or a failure to achieve desired light emitting characteristics may be avoided, and a reliable organic EL element that can be easily handled may be provided.

DEFINITIONS OF TERMS

In the following, definitions of terms including the amorphous C12A7 electride used as the electron injection layer 170 and other relevant terms are given.

(Crystalline C12A7)

In the present description, "crystalline C12A7" refers to $12CaO \cdot 7Al_2O_3$ crystals and isomorphic compounds having a crystal structure similar to the C127A crystal structure. The mineral name of this compound is "mayenite".

Crystalline C127A may include compounds in which a part or all of Ca atoms and/or Al atoms in the C12A7 crystal framework are replaced by other atoms to the extent that the framework of the C12A7 crystal lattice and the cage structure formed by the framework are retained. Crystalline C127A may also include isomorphic compounds in which a part or all of free oxygen ions in cages are replaced by other anions to the extent that the framework of the C12A7 crystal lattice and the cage structure formed by the framework are retained. Note that C12A7 may be represented as $Ca_{12}Al_{14}O_{33}$ or $Ca_{24}Al_{28}O_{66}$ in some cases.

Although not limited thereto, isomorphic compounds may include the following compounds (1)-(5), for example.

(1) Isomorphic compounds in which a part or all of Ca atoms in the crystal are replaced by at least one type of metal atoms selected from a group consisting of Sr, Mg, and Ba. For example, a compound having a part or all of Ca atoms replaced by Sr includes strontium aluminate ($Sr_{12}Al_{14}O_{33}$), and a mixed crystal including Ca and Sr at an arbitrary mix ratio includes calcium strontium aluminate ($Ca_{12-x}Sr_xAl_{14}O_{33}$, where X is an integer within the range from 1 to 11, or a number greater than 0 and less than 12 in the case where X represents a mean value).

(2) Isomorphic compounds in which a part or all of Al atoms in the crystal are replaced by at least one type of atom selected from a group consisting of Si, Ge, Ga, In, and B. $Ca_{12}Al_{10}Si_4O_{35}$ is an example of such a compound.

(3) Isomorphic compounds in which a part of metal atoms and/or non-metal atoms (except for oxygen atoms) in the $12CaO.7Al_2O_3$ crystal (including the above compounds (1) and (2)) are replaced by at least one type of transition metal atoms selected from a group consisting of Ti, V, Cr, Mn, Fe, Co, Ni, and Cu; at least one type of alkali metal atoms selected from a group consisting of typical metal atoms, Li, Na, and K; or at least one type of rare earth atoms selected from a group consisting of Ce, Pr, Nd, Sm, Eu, Gd, Tb, Dy, Ho, Er, Tm, and Yb.

(4) Compounds in which a part or all of free oxygen ions contained in the cages are replaced by other anions. Examples of other anions include, for example, $H^-$, $H_2^-$, $H^{2-}$, $O^-$, $O_2^-$ $OH^-$, $F^-$, $Cl^-$, $S^{2-}$ and nitrogen (N) anions.

(5) Compounds in which a part of the oxygen in the cage framework is replaced by nitrogen (N) and the like.

(Crystalline C12A7 Electride)

In the present description, "crystalline C12A7 electride" refers to compounds in which a part or all of the free oxygen ions contained in the cages (and other anions in the case where other anions are contained in the cages) of the crystalline C12A7 are replaced by electrons.

The electrons contained in the cages of the crystalline C12A7 electride are loosely bound to the cages and can move freely in the crystals. Thus, crystalline C12A7 electrides exhibit conductive properties. Note that a crystalline C12A7 compound having all of its free oxygen ions replaced by electrons may be expressed as $[Ca_{24}Al_{28}O_{64}]^{4+}(4e^-)$ in some cases.

(Amorphous C12A7 Electride)

In the present description, "amorphous C12A7 electride" refers to an amorphous solid material made of a solvation of amorphous C12A7 as the solvent and electrons as the solute and having the same composition as the crystalline C12A7 electride.

Figure 2:
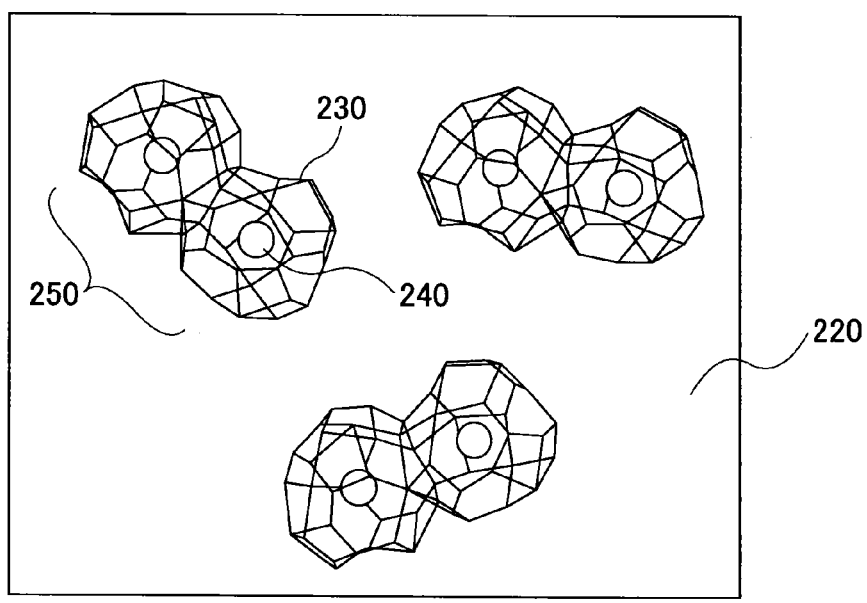
FIG. 2 schematically illustrates a structure of an amorphous C12A7 electride.

FIG. 2 schematically illustrates an exemplary structure of an amorphous C12A7 electride.

Generally, in the crystalline C12A7 electride, cages share walls to form a three-dimensional crystal lattice structure, and electrons are contained in some of the cages. On the other hand, as illustrated in FIG. 2, the amorphous C12A7 electride has characteristic partial structures called bipolarons 250 dispersed within a solvent 220 made of amorphous C12A7. The bipolaron 250 includes two adjoining cages 230 with each cage 230 containing an electron (solute) 240. Note, however, that the structure and state of the amorphous C12A7 electride is not limited to the above-described example. In other examples, each cage 230 may be arranged to contain two electrons (solute) 240.

Also, a plurality of the cages may be agglomerated in which case the agglomerated cages may be regarded as a microcrystal. Thus, the amorphous C12A7 of the present invention may include C12A7 with amorphous structures including microcrystals.

The amorphous C12A7 electride has semiconductor-like electrical properties and has a low work function. The work function of the amorphous C12A7 electride may be within a range of 2.4 eV to 4.5 eV, or a range of 3 eV to 4 eV, for example. The work function of the amorphous C12A7 electride is preferably within a range of 2.8 eV to 3.2 eV. Also, the amorphous C12A7 electride has a high ionization potential. The ionization potential of the amorphous C12A7 electride may be within a range of 7.0 eV to 9.0 eV, or within a range of 7.5 eV to 8.5 eV, for example.

The bipolaron 250 hardly exhibits light absorption at the visible light range with a photon energy range of 1.55 eV to 3.10 eV, but exhibits light absorption at around 4.6 eV. Thus, an amorphous C12A7 electride thin film is transparent with respect to visible light. Also, a sample may be tested to determine whether it contains the bipolarons 250, namely, whether the sample includes an amorphous C12A7 electride, by measuring the light absorption characteristics of the sample and measuring its light absorption coefficient at around 4.6 eV.

Also, the two adjoining cages 230 forming the bipolaron 250 are Raman active and may show a characteristic peak around 186 $cm^{-1}$ upon being measured by Raman spectroscopy.

(C12A7 Electride)

In the present description, "C12A7 electride" includes both crystalline C12A7 electrides and amorphous C12A7 electrides described above.

Note that the crystalline C12A7 electride includes Ca atoms, Al atoms, and O atoms, wherein the Ca:Al molar ratio is within a range of 13:13 to 11:15. The Ca:Al molar ratio of the crystalline C12A7 electride is preferably within a range of 12.5:13.5 to 11.5:14.5, and more preferably within a range of 12.2:13.8 to 11.8:14.2.

The amorphous C12A7 electride includes Ca atoms, Al atoms, and O atoms, wherein the Ca:Al molar ratio is within a range of 13:12 to 11:16. The Ca:Al molar ratio of the amorphous C12A7 electride is preferably within a range of 13:13 to 11:15, and more preferably within a range of 12.5:13.5 to 11.5:14.5. Further, as described below, an amorphous C12A7 electride thin film is preferably arranged such that 67%, more preferably 80%, and more preferably 95%, of the Ca, Al, and O included therein are within the above composition ranges.

(Layers of Organic EL Element 100)

In the following, the layers making up the organic EL element 100 illustrated in FIG. 1 are described in greater detail.

(Substrate 110)

The material of the substrate 110 is not particularly limited as long as it is capable of supporting the other layers constituting the organic EL element 100 that are arranged thereon. Note, however, that in the case where the light extraction face of the organic EL element 100 is arranged to be at the substrate 110 side, the substrate 110 is made of a transparent material.

Examples of a substrate made of a transparent material include a glass substrate, a plastic substrate, and a resin substrate.

(Anode 120)

A metal or a metal oxide is typically used as the anode 120. The material used for the anode 120 preferably has a work function that is greater than or equal to 4 eV. Note that, as described above, when the light extraction face of the organic EL element 100 is arranged to be at the substrate 110 side, the anode 120 needs to be transparent.

For example, the anode 120 may be made of a metal material such as aluminum, silver, tin, gold, carbon, iron, cobalt, nickel, copper, zinc, tungsten, vanadium, or an alloy thereof. Alternatively, the anode 120 may be made of a metal oxide material such as ITO, antimony oxide ($Sb_2O_3$), zirconium oxide ($ZrO_2$), tin oxide ($SnO_2$), zinc oxide (ZnO), IZO (indium zinc oxide), AZO ($ZnO$—$Al_2O_3$: aluminum-doped zinc oxide), GZO ($ZnO$—$Ga_2O_3$: gallium-doped zinc oxide), Nb-doped $TiO_2$, Ta-doped $TiO_2$, or IWZO ($In_2O_3$—$WO_3$—ZnO: indium oxide doped with tungsten trioxide and zinc oxide), for example.

Note that the method of forming the anode 120 is not particularly limited. The anode 120 may be formed using conventional deposition techniques such as vapor deposition, sputtering, or coating, for example.

Typically, the thickness of the anode 120 is in a range of 50 nm to 150 nm. In the case where a metal material is used as a transparent electrode, the thickness of the anode 120 is preferably within a range of 2 nm to 50 nm.

(Hole Injection Layer 130)

A material of the hole injection layer 130 is selected from materials having hole injecting properties.

For example, the hole injection layer 130 may be made of an organic material such as copper phthalocyanine (CuPc) or starburst amine. Alternatively, the hole injection layer 130 may be made of a metal oxide material. For example, the hole injection layer 130 may be made of an oxide material including at least one metal selected from a group consisting of molybdenum, tungsten, rhenium, vanadium, indium, tin, zinc, gallium, titanium and aluminum.

In general, when a top electrode formed on an organic layer is deposited by sputtering, the organic layer is vulnerable to sputtering damage and the characteristics of the organic EL element may be degraded as a result. However, metal oxide materials have higher resistance to sputtering compared to organic materials. Thus, by forming a metal oxide film over the organic layer, sputtering damage to the organic layer may be reduced.

Note that other known types of materials may also be used as the hole injection layer 130. Also, in some embodiments the hole injection layer 130 may be omitted.

The method of forming the hole injection layer 130 is not particularly limited. The hole injection layer 130 may be formed by a dry process such as vapor deposition or a transfer process. Alternatively, the hole injection layer 130 may be formed by a wet processes such as spin coating, spray coating, or gravure printing, for example.

The thickness of the hole injection layer 130 may typically be in the range of 1 nm to 50 nm.

(Hole Transport Layer 140)

The material of the hole transport layer 140 is selected from materials having hole transporting properties.

For example, the hole transport layer 140 may be made of an aryl amine compound, an amine compound including a carbazole group, or an amine compound including a fluorene derivative. Specific examples of materials that may be used as the hole transport layer 140 include 4,4'-bis[N-(naphthyl)-N-phenyl-amino]biphenyl(α-NPD), N,N'-bis(3-methylphenyl)-(1,1'-biphenyl)-4,4'-diamine(TPD),2-TNATA, 4,4',4''-tris(N-(3-methylphenyl)N-phenylamino) triphenylamine (MTDATA), (4,4'-N,N'-dicarbazole)biphenyl (CBP), spiro-NPD, spiro-TPD, spiro-TAD, and TNB.

Note that a variety of other known materials may be used as the hole transport layer 140 as well. Also, in some embodiments, the hole transport layer 140 may be omitted.

The hole transport layer 140 may be formed using a conventional deposition process.

The thickness of the hole transport layer 140 may typically be in a range of 1 nm to 100 nm.

(Light Emitting Layer 150)

The light emitting layer 150 may be made of any known luminescent material for an organic electroluminescence element.

For example, the light-emitting layer 150 may be made of epidorisin, 2,5-bis[5,7-di-t-pentyl-2-benzoxazolyl]thiophene, 2,2'-(1,4-phenylenedipynylene)bisbenzothiazole, 2,2'-(4,4'-biphenylene)bis-benzothiazole, 5-methyl-2-{2-[4-(5-methyl-2-benzoxazolyl)phenyl]vinyl}benzoxazole, 2,5-bis(5-methyl-2-benzoxazolyl)thiophene, anthracene, naphthalene, phenanthrene, pyrene, chrysene, perylene, perinone, 1,4-diphenyl butadiene, tetraphenyl butadiene, coumarin, acridine, stilbene, 2-(4-biphenyl)-6-phenylbenzoxazole, aluminum trisoxine, magnesium bisoxine, bis(benzo-8-quinolinol)zinc, bis(2-methyl-8-quninolinato)aluminum oxide, indium trisoxine, aluminum tris(5-methyloxine), oxine lithium, gallium trisoxine, calcium bis(5-chloro-oxine), polyzinc-bis(8-hydroxy-5-quinolinolyl)methane, dilithium epindolidione, zinc bisoxine, 1,2-phthaloperinone, 1,2-naphthaloperinone, and the like.

Note that the light emitting layer 150 may be made of a variety of other known materials as well.

The light emitting layer 150 may be formed by a dry process such as vapor deposition or a transfer process. Alternatively, the light emitting layer 150 may be formed by a wet processes such as spin coating, spray coating, or gravure printing, for example.

The thickness of the light emitting layer 150 may typically be within a range of 1 nm to 100 nm. Also, in some embodiments, the light emitting layer 150 may also be used as the hole transport layer and/or the electron transport layer.

(Electron Transport Layer 160)

Typically, the electron transport layer 160 is made of an organic material such as tris(8-quinolinolato)aluminum (Alq3). However, in general, organic materials such as Alq3 are prone to degradation upon being exposed to the atmosphere.

As such, a metal oxide material is preferably used as the electron transport layer 160.

For example, the electron transport layer 160 may be made of a metal oxide material including at least one type of material selected from a group consisting of $xZnO$-$(1-x)SiO_2$ (where x is preferably within a range of 0.5 to 0.9), $xIn_2O_3$-$(1-x)SiO_2$ (where x is preferably within a range of 0.4 to 0.8), $xSnO_2$-$(1-x)SiO_2$ (where x is preferably within a range of 0.4 to 0.8), ZnO, In—Ga—Zn—O (where In:Ga:Zn:O is preferably 1-4:1:1:1), In—Zn—O, Zn—Mg—O, Zn—Mg—Ga—O, and $SnO_2$.

These metal oxide materials may be in an amorphous phase, a crystalline phase, or an amorphous-crystalline mixed phase.

In a preferred embodiment, the metal oxide material used as the electron transport layer 160 is in an amorphous phase. This is because a relatively flat film may be easily obtained when an amorphous metal oxide material is used.

The electron affinity of these metal oxide materials is desirably within a range of 2.8 eV to 5.0 eV, more preferably 3.0 eV to 4.0 eV, and more preferably 3.1 eV to 3.5 eV. When the electron affinity is 2.8 eV or higher, desirably high electron injection characteristics may be achieved, and the light emitting efficiency of the organic EL device may be improved. Also, when the electron affinity is 5.0 eV or lower, adequate light emission could be easily obtained at the organic EL element.

By using these metal oxide materials as the electron transport layer 160, layer stability may be improved and handling of the layer may be facilitated compared to the case of using an organic material such as Alq3.

Further, note that in organic materials such as Alq3, the mobility of holes is relatively high. On the other hand, in the metal oxide materials described above, the mobility of holes is relatively low such that they can selectively transport electrons. Thus, by using these metal oxide materials as the electron transport layer 160, the light emitting efficiency of the organic EL element may be further improved.

Also, the thickness of the electron transport layer 160 made of the above metal oxide materials may be within a range of 1 nm to 2000 nm, more preferably within a range of 100 nm to 2000 nm, more preferably within a range of 200 nm to 1000 nm, and more preferably within a range of 300 nm to 500 nm. The electron mobility of the above-described metal oxide materials is within a range of 1 to 10 $cm^2V^{-1} s^{-1}$, which is several orders of magnitude greater than the electron mobility of a conventional electron transport layer made of an organic material such as Alq3. Accordingly, the thickness of the electron transport layer 160 may be increased as described above. Further, by arranging the electron transport layer 160 to have such a thickness, short circuit of the organic EL element can be reduced as compared to the case of using an organic electron transport layer. Note that when the thickness of the inorganic electron transport layer is more than 2000 nm, the required time for manufacturing the thin film may be prolonged and manufacturing costs of the organic EL element may be increased.

Note that the method for forming the electron transport layer 160 is not particularly limited. In the case of forming a film made of a metal oxide material as described above, a known film deposition technique such as vapor deposition, sputtering, or coating may be used, for example.

Also, note that in some embodiments, the electron transport layer 160 may be omitted.

(Electron Injection Layer 170)

As described above, in the organic EL element 100, an amorphous C12A7 electride is used as the electron injection layer 170.

Conventionally, the thickness of an electron injection layer is within a range of 0.1 nm to 0.4 nm. As described above, when a material such as LiF is used, the electron injection layer has to be extremely thin in view of the high resistance of the LiF material. Otherwise, it cannot be suitably used as a conductive member.

In contrast, the electronic injection layer 170 made of an amorphous C12A7 electride is electrically conductive, and as such, the electronic injection layer 170 is not constrained by such film thickness limitations. Accordingly, the electronic injection layer 170 may be formed at a relatively uniform thickness in a relatively easy manner.

For example, the thickness of the electron injection layer 170 made of an amorphous C12A7 electride may be within a range of approximately 1 nm to 50 nm. In some embodiments, the layer thickness may be less than or equal to 30 nm, or less than or equal to 20 nm, for example. Also, the layer thickness may be greater than or equal to 2 nm, greater than or equal to 4 nm, or greater than or equal to 9 nm, for example.

As described above, an amorphous C12A7 electride is a ceramic material that is stable and is not prone to alteration even when it is exposed to the atmosphere. Thus, by using an amorphous C12A7 electride as the electron injection layer 170, the electron injection layer 170 does not have to be handled under a controlled environment as in the case where lithium fluoride is used as the electron injection layer. As a result, handling may be facilitated, and reliability of the organic EL element 100 may be improved.

(Fabrication Method of Electron Injection Layer 170)

In the following, an exemplary fabrication method for fabricating an amorphous C12A7 electride thin film for the electron injection layer 170 is described.

Figure 3:
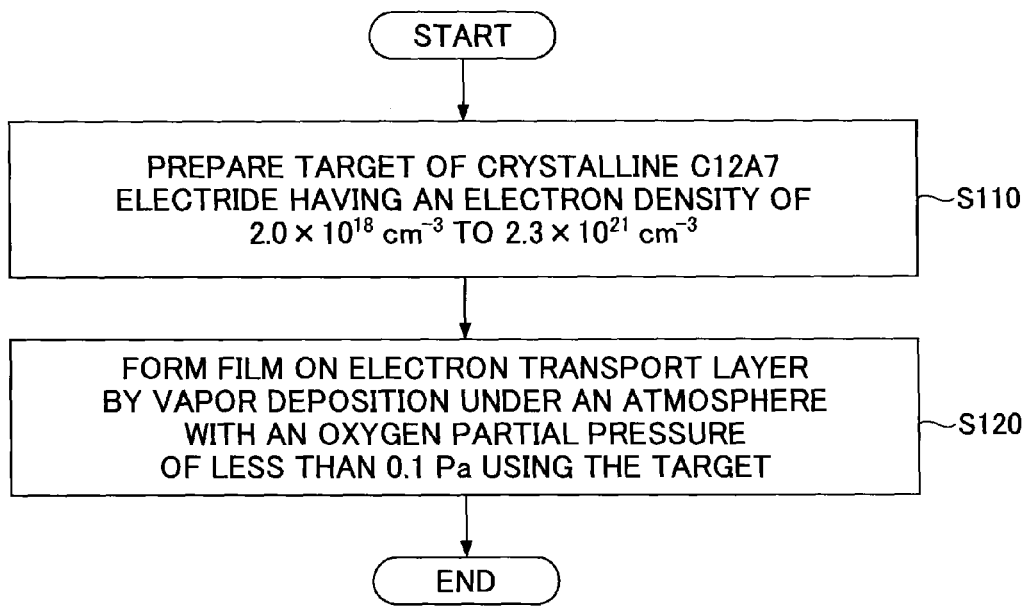
FIG. 3 is a flowchart schematically illustrating a process flow of a C12A7 electride thin film fabrication method.

FIG. 3 schematically illustrates a process flow of an amorphous C12A7 electride thin film fabrication method.

As illustrated in FIG. 3, the amorphous C12A7 electride thin film fabrication method includes:

a step of preparing a target made of a crystalline C12A7 electride having an electron density of $2.0 \times 10^{18}$ $cm^{-3}$ to $2.3 \times 10^{21}$ $cm^{-3}$ (S110); and a step of forming a film on a cathode or an electron transport layer by vapor deposition under an atmosphere with an oxygen partial pressure of less than 0.1 Pa using the above target (S120).

The above steps are described in greater detail below.

(Step S110)

First, a target for film formation to be used in the subsequent step S120 is prepared.

The target is made of a crystalline C12A7 electride.

The method to be used for fabricating the target made of the crystalline C12A7 electride is not particularly limited. For example, the target may be fabricated using the conventional method for fabricating the crystalline C12A7 electride in bulk as described above. For example, the target made of the crystalline C12A7 electride may be fabricated by performing a heating process on a sintered body of crystalline C12A7 at a temperature of around 1150-1460° C., preferably around 1200-1400° C., under the existence of a reducing agent such as Ti, Al, Ca, or C. In another example, a press-molded powder body formed by press-molding a crystalline C12A7 powder may be used as the target. A large-area target made of the crystalline C12A7 electride may be efficiently fabricated by performing a heating process on a sintered body of crystalline C12A7 at a temperature of 1230-1415° C. under the existence of carbon and metal aluminum while keeping the sintered body from coming into contact with the metal aluminum. Preferably, a target having an area with a diameter of at least 3 inches (76.2 mm) and a thickness of at least 2 mm may be fabricated. More preferably, a target having a large area with a diameter of at least 4 inches (101.6 mm) and a thickness of at least 3 mm is fabricated.

Note that the electron density of the target, namely, the crystalline C12A7 electride, is within a range of $2.0 \times 10^{18}$ $cm^{-3}$ to $2.3 \times 10^{21}$ $cm^{-3}$. The electron density of the crystalline C12A7 electride is preferably at least $1 \times 10^{19}$ $cm^{-3}$, more preferably, at least $1 \times 10^{20}$ $cm^{-3}$, and more preferably at least $5 \times 10^{20}$ $cm^{-3}$, and more preferably at least $1 \times 10^{21}$ $cm^{-3}$. Note that the higher the electron density of the crystalline C12A7 electride making up the target, the easier it is to obtain an amorphous C12A7 electride having a low work function. Particularly, to obtain an amorphous C12A7 electride having a work function of 3.0 eV or lower, the electron density of the crystalline C12A7 electride is preferably at least $1.4 \times 10^{21}$ $cm^{-3}$, more preferably at least $1.7 \times 10^{21}$ $cm^{-3}$, and more preferably at least $2 \times 10^{21}$ $cm^{-3}$. Further, in a case where all the free oxygen ions (and other anions if other anions are included) of the crystalline C12A7 electride are replaced by electrons, the electron density of the crystalline C12A7 electride is $2.3\times10^{21}$ cm$^{-3}$. If the electron density of the crystalline C12A7 electride falls below $2.0\times10^{18}$ cm$^{-3}$, the electron density of the resulting amorphous C12A7 electride thin film formed using the target may be too low.

Note that the electron density of C12A7 electride may be measured by iodometry.

Iodometry is a titration method that involves immersing a sample made of C12A7 electride in an iodine water solution of 5 mol/l, adding and dissolving hydrochloric acid into the solution, and determining the amount of unreacted iodine included in the solution using sodium thiosulfate. In this case, owing to the dissolution of the sample, the iodine in the iodine water solution is ionized by the following reaction:

$$I_2+2e^-\rightarrow 2I^- \quad (1)$$

Also, in the case where the iodine water solution is titrated with sodium thiosulfate, the unreacted iodine is converted to sodium iodide by the following reaction:

$$2Na_2S_2O_3+I_2\rightarrow 2NaI+Na_2S_4O_6 \quad (2)$$

By subtracting the amount of iodine titrated from the above equation (2) from the amount of iodine present in the initial solution, the amount of iodine consumed by the reaction of the above equation (1) may be calculated. In this way, the electron density of the C12A7 electride sample may be measured. Note that iodometry can be applied to both crystalline C12A7 electrides and amorphous C12A7 electrides.

The electron density of crystalline C12A7 electride may be measured using absorption spectroscopy. Crystalline C12A7 electride has a unique light absorption characteristic around 2.8 eV, and as such, the electron density of the crystalline C12A7 electride may be obtained by measuring its absorption coefficient at around 2.8 eV. Note that in the case where the sample is a sintered body, the sintered body may be pulverized into powder, and the powder sample may be measured using the diffuse reflection method, for example.

The target obtained by the above process is used as a raw material source in forming an amorphous C12A7 electride thin film in the next step.

Note that the surface of the target may be polished by some mechanical means, for example, before the target is used for film formation.

In general, a bulk of crystalline C12A7 electride obtained through the conventional fabrication method may have a thin coating (foreign matter) formed on its surface. When a target having such a coating formed on its surface is used as is upon carrying out a film formation process, the composition of the thin film obtained by the film formation process may deviate from the desired composition ratio. However, by polishing the target surface before using the target in the film formation process, such problems may be effectively prevented.

(Step S120)

Next, a film is formed an electron transport layer by vapor deposition using the target fabricated in step S110 described above.

In the present description, the term "vapor deposition" collectively refers to film formation methods that involve vaporizing a target raw material and depositing the raw material on a substrate, including, for example, the physical vapor deposition (PVD) method, the pulsed laser deposition (PLD) method, the sputtering method, and the vacuum deposition method.

Note that among the various vapor deposition methods that may be used, the sputtering method may be particularly suitable. By using the sputtering method, a thin film may be deposited in a relatively uniform manner within a large area.

Examples of the sputtering method include the DC (direct current) sputtering method, the high frequency sputtering method, the helicon wave sputtering method, the ion beam sputtering method, and the magnetron sputtering method.

Hereinafter, step S120 is described taking an example in which film formation is performed using the sputtering method.

Note that the temperature of the substrate on which the electride thin film is to be formed is not particularly limited, and for example, any temperature within a range from room temperature to 700° C. may be used. Note, also, that the substrate does not necessarily have to be "actively" heated. However, the temperature of the substrate may "incidentally" rise as a result of the sputtering phenomenon, for example. The temperature of the substrate may be less than or equal to 500° C., or less than or equal to 200° C., for example.

In the case where the substrate is not "actively" heated, a material that does not have adequate heat resistance to high temperatures exceeding 700° C. such as glass or plastic may be used as the material of the substrate, for example.

Note that in some embodiments, a heating process may be performed on the substrate in a vacuum atmosphere before the electride thin film is deposited thereon. For example, after exposing the substrate to the atmosphere, the substrate may be held under a vacuum of $10^{-6}$ Pa at 300° C. for 10 minutes. In this way, moisture absorbed by the substrate may be eliminated, and the surface of the substrate may be cleaned, for example.

The oxygen partial pressure at the time of film formation is preferably less than 0.1 Pa. The oxygen partial pressure is preferably 0.01 Pa or less, more preferably $1\times10^{-3}$ Pa or less, more preferably $1\times10^{-4}$ Pa or less, and more preferably $1\times10^{-5}$ Pa or less. When the oxygen partial pressure is greater than 0.1 Pa, there is a risk of oxygen being incorporated into the deposited thin film to cause a decrease in the electron density.

On the other hand, the hydrogen partial pressure at the time of film formation is preferably less than 0.004 Pa. If the hydrogen partial pressure is greater than or equal to 0.004 Pa, there is a risk of hydrogen or OH components being incorporated into the deposited thin film to cause a decrease in the electron density of the amorphous C12A7 electride thin film.

The sputtering gas used is not particularly limited. Sputtering gas may be a noble gas or an inert gas. An example of the inert gas includes $N_2$ gas. Examples of the noble gas include He (helium), Ne (neon), Ar (argon), Kr (krypton), and Xe (xenon). These gases may be used alone or in combination with other gases. Alternatively, the sputtering gas may be a reducing gas such as NO (nitric oxide).

Note that the pressure of the sputtering gas (internal pressure of the chamber) is not particularly limited and may be freely adjusted to obtain a desired thin film. In one particular example, assuming t(m) denotes the distance between the substrate and the target (target-substrate distance), and d(m) denotes the diameter of the gas molecule, the sputtering gas pressure (internal pressure of the chamber) P (Pa) may be adjusted to a pressure that satisfies the following condition:

$$8.9\times10^{-22}/(td^2)<P<4.5\times10^{-20}/(td^2) \quad (3)$$

In this case, the mean free path of sputtered particles may be approximately equal to the target-substrate distance, and the sputtered particles may be prevented from reacting with residual oxygen. Also, in this case, a relatively simple and inexpensive vacuum apparatus with a relatively high back pressure may be used as the sputtering apparatus, for example.

By implementing the above steps, an amorphous C12A7 electride thin film may be formed on a cathode or the electron transport layer 160.

The fact that the obtained thin film has a composition of C12A7 can be confirmed by composition analysis of the thin film. For example, whether the thin film has the composition of C12A7 may be evaluated by measuring the Ca/Al ratio of the thin film using the XPS method, the EPMA method, or the EDX method. If the film thickness is less than or equal to 100 nm, the XPS method may be used; if the film thickness is greater than or equal to 100 nm, the EPMA method may be used; and if the film thickness is greater than or equal to 3 μm, the EDX method may be used to analyze the thin film. Note, also, that whether the thin film is made of an amorphous C12A7 electride may be confirmed by measuring the light absorption characteristics of a sample of the thin film to determine whether light absorption occurs around a photon energy range of 4.6 eV in the manner described above.

Note that when the thin film is relatively thick, whether the thin film is made of an amorphous C12A7 electride may be confirmed using Raman spectrometry to determine whether a characteristic peak is detected at 186 cm$^{-1}$, for example.

Note that although an example using the sputtering method is described above as one exemplary method of fabricating the amorphous C12A7 electride thin film according to the present invention, the amorphous C12A7 electride thin film fabrication method is not limited to the above example. In other examples, the above two steps (steps S110 and S120) may be modified, or an additional step may be included.

For example, before forming the amorphous C12A7 electride thin film using the sputtering method in step S120 as described above, a pre-sputtering process (e.g. dry etching process) may be performed on the target.

By performing the pre-sputtering process, the surface of the target may be cleaned, and deposition of a thin film with a desired composition in the subsequent process step may be facilitated.

For example, when the target is used for a long period of time, oxygen may be incorporated into the surface of the target, possibly causing a decrease in the electron density of the crystalline C12A7 electride constituting the target. When such a target is used to form a thin film, the electron density of the deposited thin film may also decrease. Also, when the target is used for a long period of time, the composition of the target may deviate from its initial composition due to the differences in the sputtering rates of the components constituting the target (i.e. crystalline C12A7 electride). When such a target is used to form a thin film, the composition of the thin film may also deviate from the desired composition.

However, such problems may be prevented by performing a pre-sputtering process on the target. Note that the pre-sputtering process may be performed before a new film formation process is performed, or each time the amount of time the target has been used reaches a predetermined value, for example.

Also, note that the gas used in the pre-sputtering process may be the same as the sputtering gas used during the film formation process or a different gas.

Examples of preferred gases that may be used in the pre-sputtering process include He (helium), Ne (neon), $N_2$ (nitrogen), Ar (argon) and/or NO (nitric oxide).

In addition to the above, various other modifications may be made to steps S110 and S120, and a new process may be added as well.

The amorphous C12A7 electride thin film formed using the above-described fabrication method has an electron density within a range that is greater than or equal to $2.0 \times 10^{18}$ cm$^{-3}$ and less than or equal to $2.3 \times 10^{21}$ cm$^{-3}$, and exhibits light absorption at a photon energy position of 4.6 eV. The electron density of the amorphous C12A7 electride thin film is preferably greater than or equal to $1 \times 10^{19}$ cm$^{-3}$, and more preferably greater than or equal to $1 \times 10^{20}$ cm$^{-3}$.

Note that the electron density of the amorphous C12A7 electride thin film may be measured using iodometry as described above. Also, the bipolaron density of the amorphous C12A7 electride thin film may be obtained by multiplying the measured electron density by ½.

The amorphous C12A7 electride thin film has conductive properties owing to hopping conduction of electrons within the cages. The DC conductivity of the amorphous C12A7 electride thin film at room temperature may be $10^{-9}$ to $10^{-1}$ S·cm$^{-1}$, or more preferably, $10^{-7}$ to $10^{-3}$ S·cm$^{-1}$, for example.

The amorphous C12A7 electride thin film of the present embodiment may include $F^+$ centers having an electron trapped in an oxygen vacancy as a partial structure in addition to the bipolarons 250, for example. The $F^+$ center has an electron surrounded by a plurality of $Ca^{2+}$ ions but does not have cages. The $F^+$ center has a light absorption band in the visible light range of 1.55 eV to 3.10 eV with a peak at 3.3 eV.

Note that the concentration of $F^+$ centers within the thin film is preferably less than $5 \times 10^{18}$ cm$^{-3}$, and in this way, the thin film may have a desirably high transparency. The $F^+$ center concentration is more preferably less than or equal to $1 \times 10^{18}$ cm$^{-3}$, and more preferably less than or equal to $1 \times 10^{17}$ cm$^{-3}$. Note that the $F^+$ center concentration may be measured by ESR based on the signal intensity of a g-factor of 1.998.

In the amorphous C12A7 electride thin film of the present embodiment, the ratio of the light absorption coefficient at a photon energy position of 3.3 eV to the light absorption coefficient at a photon energy position of 4.6 eV may be less than or equal to 0.35.

The flatness of an amorphous C12A7 electride thin film is superior to that of a polycrystalline thin film because the amorphous C12A7 electride thin film does not have crystal grain boundaries. The RMS (root mean square) granularity of the surface of the amorphous C12A7 electride thin film may be within a range of 0.1 nm to 10 nm, and more preferably within a range of 0.2 nm, to 5 nm, for example. Note that by using an amorphous C12A7 electride thin film having a RMS granularity that is less than or equal to 2 nm as the electron injection layer 170, characteristics of the organic EL element 100 may be further improved. Also, when the RMS granularity is 10 nm or greater, characteristics of the organic EL element 100 may potentially be degraded, and therefore, a polishing process or the like may have to be additionally implemented, for example. Note that the RMS granularity may be measured using atomic force microscopy, for example.

(Cathode 180)

The cathode 180 is typically made of a metal material. Note that in a case where the light extraction face of the organic EL element 100 is arranged to be at the cathode 180 side, the cathode 180 has to be transparent.

For example, the cathode 180 may be made of aluminum, silver, gold, magnesium, calcium, titanium, yttrium, lithium, gadolinium, ytterbium, ruthenium, manganese, molybdenum, vanadium, chromium, tantalum, or an alloy thereof. Alternatively, the cathode 180 may be made of a metal oxide material such as ITO, antimony oxide ($Sb_2O_3$), zirconium oxide ($ZrO_2$), tin oxide ($SnO_2$), zinc oxide (ZnO), IZO (indium zinc oxide), AZO (ZnO—$Al_2O_3$: aluminum-doped zinc oxide), GZO (ZnO—$Ga_2O_3$: gallium-doped zinc oxide), Nb-doped $TiO_2$, Ta-doped $TiO_2$, and IWZO ($In_2O_3$—$WO_3$—ZnO: indium oxide doped with tungsten trioxide and zinc oxide.

The film forming method for forming the cathode 180 is not particularly limited. For example, the cathode 180 may be formed by vapor deposition (e.g. vacuum deposition, electron beam deposition), ion plating, laser ablation, or sputtering.

The thickness of the cathode 180 may typically be within a range of 50 nm to 150 nm. In the case of forming a transparent electrode using a metal material, the thickness of the cathode 180 is preferably within a range of 2 nm to 50 nm.

In the exemplary configuration of the organic EL element 100 illustrated in FIG. 1, the anode 120 is arranged closer to the substrate 110, and the cathode 180 is arranged farther from the substrate 110. However, in the present invention, the configuration of the organic EL element is not limited to the illustrated example. In other examples, the positioning of the anode 120 and the cathode 180 with respect to the substrate 110 as illustrated in FIG. 1 may be reversed such that the cathode 180 is arranged closer to the substrate 110, and the anode 120 is arranged farther from the substrate 110. In this case, the organic EL element may be configured to have the layers other than the substrate 110, namely layers 120-180 of FIG. 1, arranged upside down. In one preferred embodiment, a (transparent) electrode, an amorphous C12A7 electride, and an electron transport layer made of a metal oxide material may be successively deposited on the substrate in this order by sputtering. In this way, the electrode and the amorphous C12A7 electride may be protected by the electron transport layer that is made of a metal oxide material having excellent chemical durability and mechanical strength. Such a layered structure may be stable and may therefore be easily transported in the atmosphere. As a result, fabrication of the organic EL element may be simplified, for example.

Note that in the example of FIG. 1, the organic EL element 100 includes an electron injection layer 170 made of an amorphous C12A7 electride thin film. However, the electron injection layer 170 does not necessarily have to be included. That is, in some embodiments, the electron injection layer 170 may be omitted. In this case, the cathode 180 may be made of an amorphous C12A7 electride thin film. Alternatively, both the electron injection layer 170 and the cathode 180 may be made of amorphous C12A7 electride thin films, for example.

Other Embodiments

According to another embodiment of the present invention, an organic electroluminescence element fabrication method is provided for forming an organic electroluminescence element having a anode, a light emitting layer, and a cathode arranged in this order, and having an electron injection layer arranged between the light emitting layer and the cathode. The fabrication method involves forming the electron injection layer that is made of an amorphous thin film on the cathode or the light emitting layer by vapor deposition under a low-oxygen-partial-pressure atmosphere using a target made of a crystalline C12A7 electride having an electron density within a range of $2.0\times10^{18}$ cm$^{-3}$ to $2.3\times10^{21}$ cm$^{-3}$.

According to another embodiment of the present invention, an organic electroluminescence element fabrication method is provided for forming an organic electroluminescence element having a anode, a light emitting layer, and a cathode arranged in this order, and having an electron injection layer arranged between the light emitting layer and the cathode. The fabrication method involves forming the cathode that is made of an amorphous thin film by vapor deposition under a low-oxygen-partial-pressure atmosphere using a target made of a crystalline C12A7 electride having an electron density within a range of $2.0\times10^{18}$ cm$^{-3}$ to $2.3\times10^{21}$ cm$^{-3}$.

The amorphous thin film constituting the electron injection layer or the cathode may be made of an amorphous solid material including calcium, aluminum, and oxygen, for example. That is, the amorphous thin film may be made of an electride of an amorphous oxidized material including calcium atoms and aluminum atoms. Note that amorphous states according to the present invention encompass amorphous structures containing microcrystals. The amorphous thin film preferably has a Ca/Al molar ratio within a range of 0.5 to 4.7, more preferably within a range of 0.6 to 3, and more preferably within a range of 0.8 to 2.5. Note that composition analysis of the thin film may be performed using the XPS method, the EPMA method, or the EDX method, for example.

The amorphous thin film may have a composition that is different from the stoichiometric ratio of C12A7 and different from the composition ratio of the target used for fabricating the thin film. Note that in the case where the thin film is crystalline and the composition of the thin film is different from the stoichiometric ratio of C12A7, the thin film would be made of a mixture of a C12A7 crystal and a C3A ($3CaO.Al_2O_3$) crystal and/or a CA($3CaO.Al_2O_3$) crystal. C3A crystals and CA crystals are insulators with relatively large work functions, and their electrical characteristics vary depending on the crystalline site. Also, the thermal characteristics and mechanical characteristics of these crystals vary, and they tend to form discontinuous crystal grain boundaries such that the surface flatness may be compromised. On the other hand, even when the composition of the amorphous thin film is different from the stoichiometric ratio of C12A7, because different phases such as the C3A phase and the CA phase are not formed, homogeneity and surface flatness may be achieved.

The electron density of the amorphous thin film is preferably within a range that is greater than or equal to $2.0\times10^{18}$ cm$^{-3}$ and less than or equal to $2.3\times10^{21}$ cm$^{-3}$. The electron density of the amorphous thin film is more preferably greater than or equal to $1\times10^{19}$ cm$^{-3}$, and more preferably greater than or equal to $1\times10^{20}$ cm$^{-3}$. Also, the amorphous thin film preferably exhibits light absorption at a photon energy position of 4.6 eV.

The amorphous thin film has semiconductor-like electrical characteristics, and has a low work function. The work function of the amorphous thin film may be within a range of 2.4 eV to 4.5 eV, or within a range of 2.8 eV to 3.2 eV, for example. Also, the amorphous thin film has high ionization potential. The ionization potential of the amorphous thin film may be within a range of 7.0 eV to 9.0 eV, or within a range of 7.5 eV to 8.5 eV, for example. The amorphous thin film has an $F^+$ center concentration of less than $5\times10^{18}$ cm$^{-3}$, and thus has a desirably high transparency. The $F^+$ center concentration is more preferably less than or equal to $1\times10^{18}$ cm$^{-3}$, and more preferably less than or equal to $1\times10^{17}$ cm$^{-3}$. Further, in the amorphous thin film, the ratio of the light absorption coefficient at a photon energy position of 3.3 eV to the light absorption coefficient at a photon energy position of 4.6 eV may be less than or equal to 0.35.

Note that descriptions of configurations, implementation modes, and analysis methods to be used in connection with the above embodiments that may be substantially identical to those described in connection with the previously described embodiments (e.g. steps S110 and S120) are hereby omitted.

An organic electroluminescence element according to an embodiment of the present invention may have one of the following configurations, for example.

(1) Configuration including a substrate, an anode, and a cathode arranged in this order; a light extraction face arranged at the substrate side; an amorphous thin film made of an amorphous solid material including calcium, aluminum, and oxygen arranged between the anode and the cathode or constituting the cathode.

(2) Configuration including a substrate, an anode, and a cathode arranged in this order; a light extraction face arranged at the cathode side; an amorphous thin film made of an amorphous solid material including calcium, aluminum, and oxygen arranged between the anode and the cathode or constituting the cathode.

(3) Configuration including a substrate, a cathode, and an anode arranged in this order; a light extraction face arranged at the substrate side; an amorphous thin film made of an amorphous solid material including calcium, aluminum, and oxygen arranged between the anode and the cathode or constituting the cathode.

(4) Configuration including a substrate, a cathode, and an anode arranged in this order; a light extraction face arranged at the anode side; an amorphous thin film made of an amorphous solid material including calcium, aluminum, and oxygen arranged between the anode and the cathode or constituting the cathode.

Note that in a case where the organic EL element of the present invention is used in combination with a thin film transistor (TFT) including a transparent amorphous oxide semiconductor to configure a light emitting device, the above configurations (2) and (4) are preferred in view of the aperture ratio. Also, in view of the luminance stability of the light emitting device, the above configuration (3) or (4) may be preferable. The light emitting device may be a display device, or a lighting device, for example.

EXAMPLES

In the following, specific examples of the present invention are described.

Example 1

A sample simulating a configuration of a cathode portion of an organic EL element was prepared in the following manner, and its characteristics were evaluated.

(Sample Fabrication)

Figure 4:
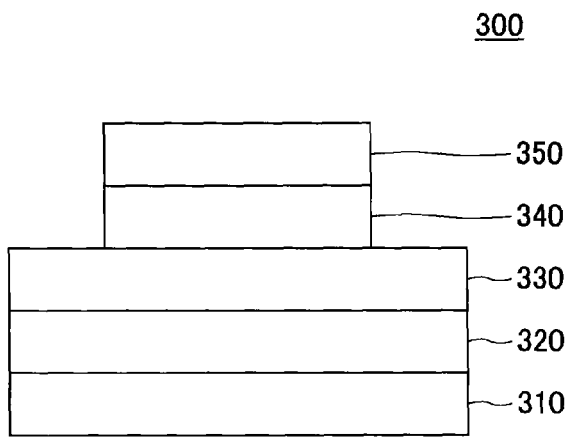
FIG. 4 is a schematic cross-sectional view of sample 300 fabricated according to an embodiment of the present invention.

A sample having a configuration as illustrated in FIG. 4 (hereinafter referred to as "sample 300") was fabricated in the following manner.

First, a 50 mm×50 mm×0.7 mm glass substrate 310 (made of non-alkali glass) was prepared.

Then, the glass substrate 310 was introduced into a sputtering apparatus and a metal aluminum layer 320 as an anode was formed on one surface of the glass substrate 310 by sputtering. The thickness of the metal aluminum layer 320 was arranged to be approximately 100 nm.

Then, the glass substrate 310 having the anode formed thereon was taken out of the sputtering apparatus and was introduced into another sputtering apparatus in which an amorphous C12A7 electride layer as an electron injection layer 330 was formed on the metal aluminum layer 320.

Note that the amorphous C12A7 electride layer was formed using the fabrication method described above with reference to FIG. 3. The electron density of the crystalline C12A7 electride constituting the target was $5\times10^{20}$ cm$^{-3}$. Using such a target, the amorphous C12A7 electride layer was formed by sputtering under a low-oxygen-partial-pressure atmosphere of less than approximately $4.3\times10^{-7}$ Pa. Ar was used as the sputtering gas, and the pressure of the introduced gas was adjusted to 2.13 Pa. Also, a pre-sputtering process using He gas was performed on the target. Note that the glass substrate 310 was not actively heated.

The thickness of the resulting amorphous C12A7 electride layer was approximately 10 nm.

Then, the glass substrate 310 having the electron injection layer 330 (and the metal aluminum layer 320) formed thereon was removed from the sputtering apparatus. Then, the glass substrate 310 was introduced into a vapor deposition apparatus where an Alq3 layer as an electron transport layer 340 was formed on the amorphous C12A7 electride layer by vapor deposition. The thickness of the Alq3 layer was arranged to be approximately 60 nm. Note that a metal mask was used to form the Alq3 layer into a 12-mm-diameter region arranged near the center of the electron injection layer 330 surface.

Then, a 2 mm×2 mm evaluation electrode 350 was arranged on the glass substrate 310 having the electron transport layer 340 formed thereon by vapor deposition. The evaluation electrode 350 was made of metal aluminum and the thickness of the evaluation electrode 350 was arranged to be approximately 100 nm.

By implementing the above steps, the sample 300 including the glass substrate 310, the metal aluminum layer 320, the electron injection layer 330, the electron transport layer 340, and the evaluation electrode 350 was fabricated.

Also, another sample 301 was fabricated in a similar manner as a comparative example. Note, however, that that step of forming the amorphous C12A7 electride layer was not performed upon fabricating the sample 301. Accordingly, the sample 301 does not include the electron injection layer 330 and instead has the electron transport layer 340 arranged directly on the metal aluminum layer 320.

(Electron Injection Characteristics Evaluation)

Next, the electron injection characteristics of the above samples 300 and 301 were evaluated.

The electron injection characteristics of the samples 300 and 301 were evaluated by measuring the current value obtained upon applying a predetermined voltage between the metal aluminum layer 320 and the evaluation electrode 350 of each of the samples 300 and 301. The applied voltage was arranged to be within a range of 0 V to 10 V (based on the metal aluminum layer 320).

Figure 5:
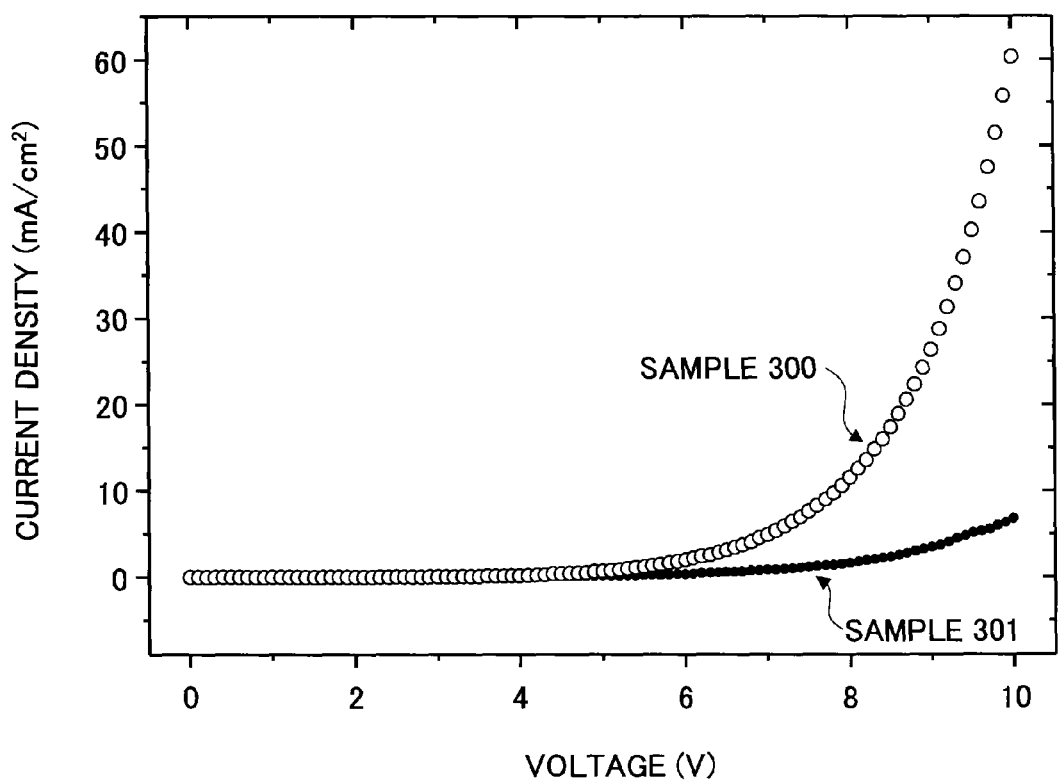
FIG. 5 is a graph illustrating electron injection characteristics evaluation results of samples 300 and 301.

FIG. 5 represents the measurement results obtained from the above evaluation. In the graph of FIG. 5, the vertical axis represents the current density generated between the metal aluminum layer 320 and the evaluation electrode 350.

It can be appreciated from these measurement results that in the sample 300 including the electron injection layer 330 made of an amorphous C12A7 electride, the current density at a given voltage is substantially higher than the current density at the same voltage in the sample 301 without the electron injection layer 330 made of an amorphous C12A7 electride (particularly at voltages greater than 6V).

Based on these results, it could be confirmed that by arranging the electron injection layer 330 made of an amorphous C12A7 electride as the electron injection layer, the electron injection barrier may be reduced and the current characteristics of the sample 300 may be improved.

Also, in the fabrication process of the sample 300, after forming the electron injection layer 330 made of an amorphous C12A7 electride, the sample is temporarily exposed to the atmosphere. Nevertheless, desirable electron injection characteristics could still achieved in the sample 300. This indicates that by using an amorphous C12A7 electride layer as the electron injection layer 330, a relatively stable organic EL element may be fabricated without having to account for influences of the environment.

Example 2

Samples were fabricated in a manner similar to the above Example 1 except that the Alq3 layer was arranged to have a thickness of approximately 150 nm. Specifically, a sample 302 including the electron injection layer 330 made of an amorphous C12A7 electride, and a sample 303 without the electron injection layer 330 made of an amorphous C12A7 electride were fabricated.

Figure 6:
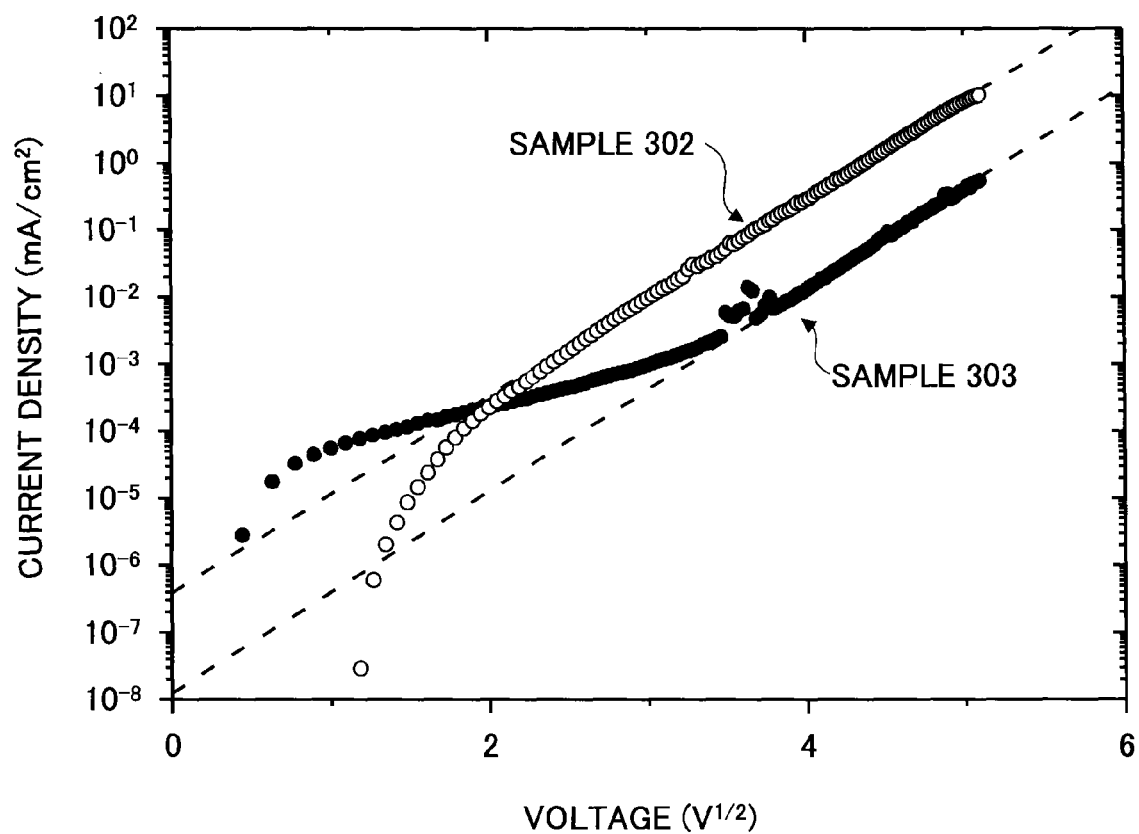
FIG. 6 is a graph illustrating electron injection characteristics evaluation results of samples 302 and 303.

FIG. 6 illustrates evaluation measurement results of the samples 302 and 303. As can be appreciated from FIG. 6, the current-voltage characteristics of the sample 302 throughout most of the voltage range substantially follows the relationship, $\log J = J^0 + CV^{1/2}$, representing current-voltage characteristics across a Schottky barrier junction. Note that in the above equation, J denotes the current density, V denotes the voltage, and $J_0$ and C are constants.

The hole injection barrier from the metal aluminum constituting the evaluation electrode 350 (anode) to Alq3 is known to be relatively large at approximately 2.9 eV, and as such, it could be appreciated that the current-voltage characteristics of the sample 302 are dominated by Schottky barriers formed between the amorphous C12A7 electride and Alq3. The Schottky barrier height ΦSB was estimated based on the value of $J_0$ obtained from the above current-voltage characteristics, and using the relationship, $J_0 = AT^2 \exp(-\Phi_{SB}/k_B T)$ (where A denotes the Richardson constant, T denotes the absolute temperature, and $k_B$ denotes the Boltzmann constant). In this example, the Schottky barrier height ΦSB was estimated to be approximately 0.98 eV.

Also, as illustrated in FIG. 6, the current-voltage characteristics of the sample 303 do not follow the relationship, $\log J = J^0 + CV^{1/2}$, at the lower voltage range. Also, it can be appreciated that the current value of the sample 303 is greater than that of the sample 302, indicating that a short-circuit current is generated in the sample 303. Such differences between the samples 302 and 303 may be attributed to the superior surface flatness of the sample 302. That is, metal aluminum is a polycrystalline material and therefore has a relatively rough surface caused by grain boundaries. However, the surface flatness is improved in the sample 302 by having the amorphous C12A7 electride thin film formed on the metal aluminum layer. Also, upon estimating the Schottky barrier height ΦSB from the current-voltage characteristics of the sample 303 at the higher voltage range following the relationship, $\log J = J^0 + CV^{1/2}$, the Schottky barrier height ΦSB in the sample 303 was estimated to be approximately 1.07 eV.

Based on the above, it can be appreciated that by using an amorphous C12A7 electride thin film as an electron injection layer to fabricate an organic El element, the short-circuit current may be reduced, the Schottky barrier height may be reduced, and electron injection characteristics for injecting electrons into an electron transport layer may be improved.

Example 3

Samples simulating the configuration of a cathode portion of an organic EL element was fabricated in the following manner, and their characteristics were evaluated.

(Sample Fabrication)

According to the following procedures, a sample 304 having an electron injection layer 330 made of an amorphous C12A7 electride, a sample 305 having an electron injection layer 330 made of lithium fluoride, and a sample 306 that does not include an electron injection layer 330 a were fabricated.

First, a 10 mm×10 mm×0.7 mm glass substrate 310 (made of alkali-free glass) was prepared.

Then, the glass substrate 310 was introduced into a sputtering apparatus, and on one surface of the glass substrate 310, a metal aluminum layer 320 was formed as a cathode by sputtering. The metal aluminum layer 320 was arranged into a 4 mm×1 mm×100 nm layer.

Then, the glass substrate 310 having the cathode formed thereon was removed from the sputtering apparatus, and introduced into another sputtering apparatus where an amorphous C12A7 electride layer was formed as the electron injection layer 330 on the metal aluminum layer 320.

The amorphous C12A7 electride layer was formed using the fabrication method described above with reference to FIG. 3. The electron density of the crystalline C12A7 electride constituting the target was $8.5 \times 10^{20}$ cm$^{-3}$. Using this target, the amorphous C12A7 electride layer was formed by sputtering under a low-oxygen-partial-pressure atmosphere of less than approximately $4.3 \times 10^{-7}$ Pa. Ar was used as the sputtering gas, and the pressure of the introduced gas was arranged to be 2.13 Pa. Also, a pre-sputtering process using He gas was performed on the target. Note that the glass substrate 310 with the cathode was not actively heated.

The thickness of the resulting amorphous C12A7 electride layer was approximately 1 nm.

Then, the glass substrate 310 having the electron injection layer 330 (and the metal aluminum layer 320) formed thereon was removed from the sputtering apparatus. Then, the glass substrate 310 was introduced into a deposition apparatus that is capable of performing a plasma process, and a plasma cleaning process was performed, followed by an evaporation process. The plasma process was performed for 1 minute using He gas at a pressure of 0.6 Pa and at an RF power of 50 W.

Then, an Alq3 layer was formed as an electron transport layer 340 on the amorphous C12A7 electride by vapor deposition. The thickness of the Alq3 layer was approximately 150 nm. Note that a metal mask was used to form the Alq3 layer into a 2 mm×2 mm region completely covering the electron injection layer 330. The degree of vacuum during the deposition was about $3 \times 10^{-6}$ Pa.

Then, a 1 mm×4 mm×80 nm evaluation electrode 350 was formed by vapor deposition on the glass substrate 310 having the electron transport layer 340 formed thereon. The evaluation electrode 350 was arranged to be orthogonal to the cathode. That is, a 1 mm×1 mm region where the cathode and the evaluation electrode 350 overlap corresponds to a region where a current flows upon voltage application. The evaluation electrode 350 was made of metal aluminum.

By implementing the above steps, the sample 304 including the glass substrate 310, the metal aluminum layer 320, the electron injection layer 330 made of an amorphous C12A7 electride, the electron transport layer 340, and the evaluation electrode 350 was fabricated.

Then, the sample 305 having an electron injection layer 330 made of lithium fluoride was fabricated in the following manner.

First, a 10 mm×10 mm×0.7 mm glass substrate 310 (made of alkali-free glass) was prepared.

Then, the glass substrate 310 was introduced into a sputtering apparatus, and on one surface of the glass substrate 310, a metal aluminum layer 320 was formed as a cathode by sputtering. The metal aluminum layer 320 was arranged into a 4 mm×1 mm×100 nm layer.

Then, the glass substrate 310 having the metal aluminum layer 320 formed thereon was removed from the sputtering apparatus. Then, the glass substrate 310 was introduced into a deposition apparatus capable of performing a plasma process, and a plasma cleaning process was performed, followed by an evaporation process. The plasma process was performed for 1 minute using He gas under a pressure of 0.6 Pa at an RF power of 50 W.

Then, a lithium fluoride layer was formed as the electron injection layer 330 on the metal aluminum layer 320 by vapor deposition. The degree of vacuum during the deposition was approximately $3 \times 10^{-6}$ Pa. The thickness of the lithium fluoride layer was approximately 0.5 nm.

Then, an Alq3 layer as an electron transport layer 340 and an evaluation electrode 350 were formed on the lithium fluoride layer by vapor deposition in a manner similar to the methods used for the sample 304.

By implementing the above steps, the sample 305 including the glass substrate 310, the metal aluminum layer 320, the electron injection layer 330 made of lithium fluoride, the electron transport layer 340, and the evaluation electrode 350 was fabricated.

Further, the sample 306 having no electron injection layer 330 was fabricated in the following manner.

First, a 10 mm×10 mm×0.7 mm glass substrate 310 (made of alkali-free glass) was prepared.

Then, the glass substrate 310 was introduced into a deposition apparatus, and on one surface of the glass substrate 310, a metal aluminum layer 320 was formed as a cathode by vapor deposition. The metal aluminum layer 320 was arranged into a 4 mm×1 mm×100 nm layer. The degree of vacuum during vapor deposition was approximately $3 \times 10^{-6}$ Pa.

Then, an Alq3 layer as an electron transport layer 340 and an evaluation electrode 350 were formed on the metal aluminum layer 320 by vapor deposition in the same manner as the Alq3 layer and the evaluation electrode 350 of the sample 304.

By implementing the above steps, the sample 306 including the glass substrate 310, the metal aluminum layer 320, the electron transport layer 340, and the evaluation electrode 350 was fabricated. The sample 306 does not include an electron injection layer 330, and instead, the electron transport layer 340 is arranged directly on the metal aluminum layer 320.

(Electron Injection Characteristics Evaluation)

Next, the electron injection characteristics of the above samples 304, 305, and 306 were evaluated.

Electron injection characteristics of the samples 304, 305, and 306 were evaluated by measuring a current value obtained upon applying a predetermined voltage between the metal aluminum layer 320 and the evaluation electrode 350. The applied voltage was arranged to be within a range of 0 V to 10 V (based on the metal aluminum layer 320).

Figure 7:
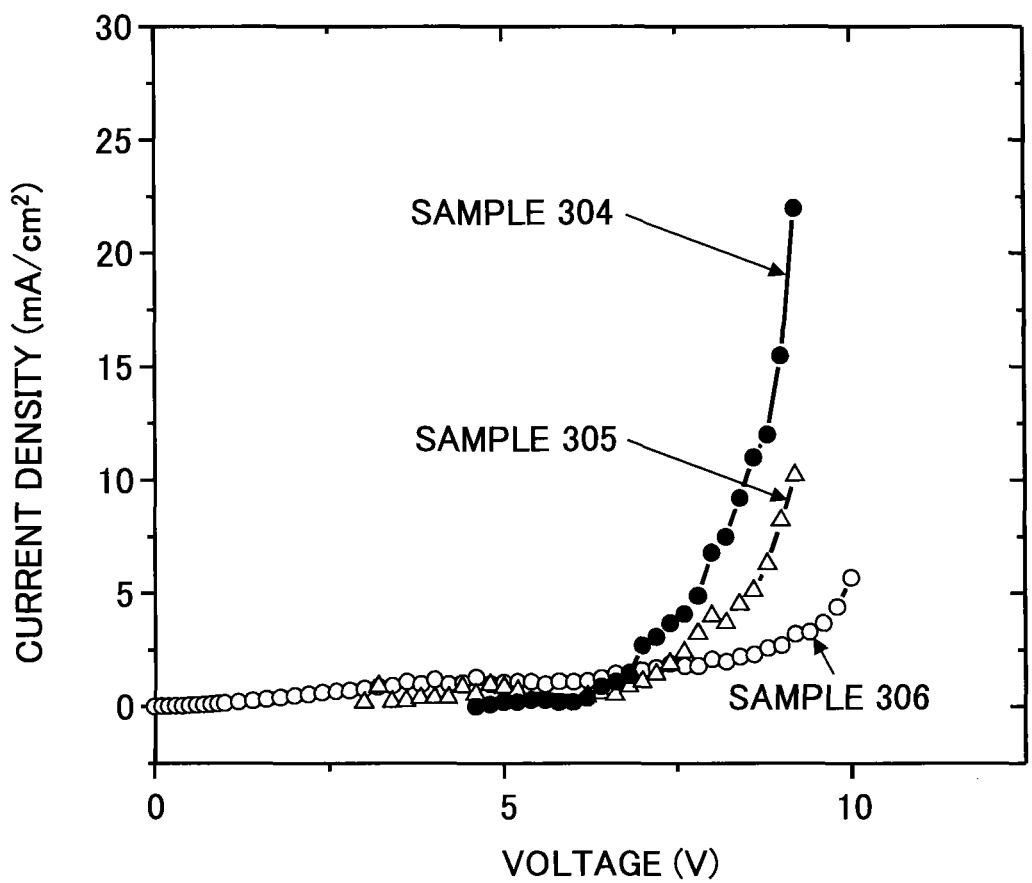
FIG. 7 is a graph illustrating electron injection characteristics evaluation results of samples 304, 305, and 306.

FIG. 7 illustrates the measurement results of the above evaluation. In FIG. 7, the horizontal axis represents the applied voltage (based on the metal aluminum layer 320), and the vertical axis represents the current density generated between the metal aluminum layer 320 and the evaluation electrode 350.

It can be appreciated from these measurement results that in the sample 304 including the electron injection layer 330 made of an amorphous C12A7 electride, the current density at a given voltage is substantially higher than the current densities at the same voltage for the sample 305 having the electron injection layer 330 made of lithium fluoride and the sample 306 having no electron injection layer 330 (particularly when the applied voltage is higher than 6 V).

Based on the above, it could be confirmed that by arranging the electron injection layer 330 made of an amorphous C12A7 electride, the electron injection barrier may be reduced, and the current characteristics of the samples may be improved.

Example 4

Organic EL element samples were fabricated in the following manner, and their characteristics were evaluated. The organic EL element samples fabricated in the present example were configured to include a glass substrate having a cathode arranged thereon as a bottom electrode. The organic EL element samples were further configured to have an electron injection layer, an electron transport layer/light emitting layer, a hole transport layer, a hole injection layer, and an anode as a top electrode arranged in this order on the cathode corresponding to the bottom electrode. Also, the organic EL element samples were configured to extract light from the anode side.

(Sample Fabrication)

Figure 8:
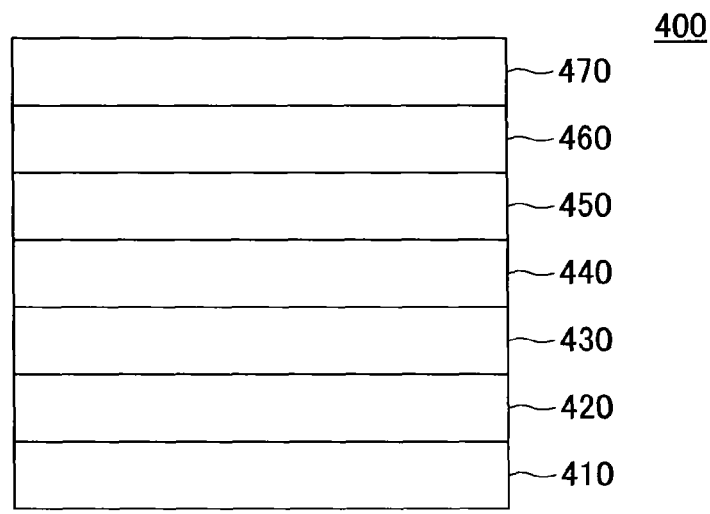
FIG. 8 is a schematic cross-sectional view of organic electroluminescence element 400 fabricated according to an embodiment of the present invention.

An organic EL element 400 having a configuration as illustrated in FIG. 8 was fabricated in the following manner.

First, a 30 mm×30 mm×0.7 mm glass substrate 410 (made of alkali-free glass) was prepared.

After cleaning the glass substrate 410, aluminum metal was deposited on one surface of the glass substrate 410 by sputtering to form a cathode 420. The cathode 420 was arranged into a 28 mm×2 mm×100 nm film.

Then, the glass substrate 410 with the cathode 420 was removed from a sputtering apparatus and was exposed to the atmosphere, after which the glass substrate 410 was introduced into another sputtering apparatus capable of performing a heating process and was held in a vacuum of approximately $3 \times 10^{-5}$ Pa for 10 minutes at a temperature of 300° C. After being cooled down to approximately 70° C., an amorphous C12A7 electride layer was formed as an electron injection layer 430 on the cathode 420. Note that the substrate was no actively heated upon forming the electride layer.

The amorphous C12A7 electride layer was formed by sputtering using a target made of a crystalline C12A7 electride having an electron density of $1.5 \times 10^{21}$ cm$^{-3}$. The atmosphere during the sputtering process was adjusted to have an oxygen partial pressure of less than approximately $4.3 \times 10^{-7}$ Pa. Ar was used as the sputtering gas, and the pressure of the introduced gas was adjusted to 0.21 Pa. Also, a pre-sputtering process using Ar gas was performed before the above sputtering process for forming the amorphous C12A7 electride layer.

The thickness of the resulting amorphous C12A7 electride layer was approximately 1 nm.

Then, the glass substrate 410 having the electron injection layer 430 (and the cathode 420) formed thereon was removed from the sputtering apparatus and exposed to the atmosphere. Then, the glass substrate 410 was introduced into a deposition apparatus capable of performing a substrate heating process and subjected to a heating process at 300° C. for 10 minutes in a vacuum of approximately $3 \times 10^{-6}$ Pa. Then, after the glass substrate 410 was cooled to approximately 70° C., the following deposition process was performed.

An Alq3 layer was formed as an electron transport layer/light emitting layer 440 on the amorphous C12A7 electride layer by vapor deposition. The thickness of the Alq3 was arranged to be approximately 50 nm. Then, an α-NPD layer was formed as a hole transport layer 450. The thickness of the α-NPD layer was arranged to be approximately 50 nm. Further, a CuPc layer was formed as a hole injection layer 460. The thickness of the CuPc layer was arranged to be approximately 30 nm.

Note that a metal mask was used to form the Alq3 layer, the α-NPD layer, and the CuPc layer into 20 mm×20 mm regions that completely cover the electron injection layer 430. The degree of vacuum during the deposition process was adjusted to be approximately $3 \times 10^{-6}$ Pa.

Then, a 2 mm×13 mm×5 nm anode 470 was formed to be orthogonal to the cathode. That is, a 2 mm×2 mm region where the cathode and the anode overlap corresponds to a region where a current flows upon voltage application. The anode 470 is made of gold.

By implementing the above steps, the organic EL element 400 including the glass substrate 410, the cathode 420 made of metal aluminum, the electron injection layer 430 made of an amorphous C12A7 electride, the electron transport layer/light emitting layer 440 made of Alq3, the hole transport layer 450 made of α-NPD, the hole injection layer 460 made of CuPc, and the anode 470 made of gold was fabricated.

Then, an organic EL element 401 having an electron injection layer 430 made of lithium fluoride was fabricated in the following manner.

First, a 30 mm×30 mm×0.7 mm glass substrate 410 (made of alkali-free glass) was prepared.

After cleaning the glass substrate 410, metal aluminum was deposited on one surface of the glass substrate 410 by sputtering to form a cathode 420 made of metal aluminum. The cathode 420 was formed into a 28 mm×2 mm×100 nm film.

Then, the glass substrate 410 having the cathode 420 formed thereon was removed from a sputtering apparatus and exposed to the atmosphere, after which the glass substrate 410 was introduced into a deposition apparatus capable of performing a substrate heating process and was subject to a heating process at a temperature of 300° C. for 10 minutes in a vacuum of approximately $3 \times 10^{-6}$ Pa. After being cooled to approximately 70° C., the following the deposition process was performed on the glass substrate 410.

A lithium fluoride layer was formed as an electron injection layer 430 by a vapor deposition. The degree of vacuum during the deposition was adjusted to be approximately $3 \times 10^{-6}$ Pa. The thickness of the lithium fluoride layer was arranged to be approximately 0.5 nm.

Then, on the lithium fluoride layer, an electron transport layer/light emitting layer 440 made of Alq3, a hole transport layer 450 made of α-NPD, a hole injection layer 460 made of CuPc, and an anode 470 made of gold were fabricated in a manner similar to the methods used for the organic EL element 400. In this way, the organic EL element 401 was fabricated.

(Organic EL Element Evaluation)

Then, the current, the voltage, and the luminance of the above organic EL elements 400 and 401 were measured.

The measurements were obtained for each of the organic EL elements 400 and 401 by measuring the current value and the luminance upon applying a predetermined voltage between the cathode 420 and the anode 470 of the organic EL elements 400 or 401 within a glove box purged of nitrogen. The applied voltage was arranged to be within a range of 0 V to 21 V (based on the cathode 420). The luminance was measured using a luminance meter (BM-7A) manufactured by TOPCOM.

Figure 9:
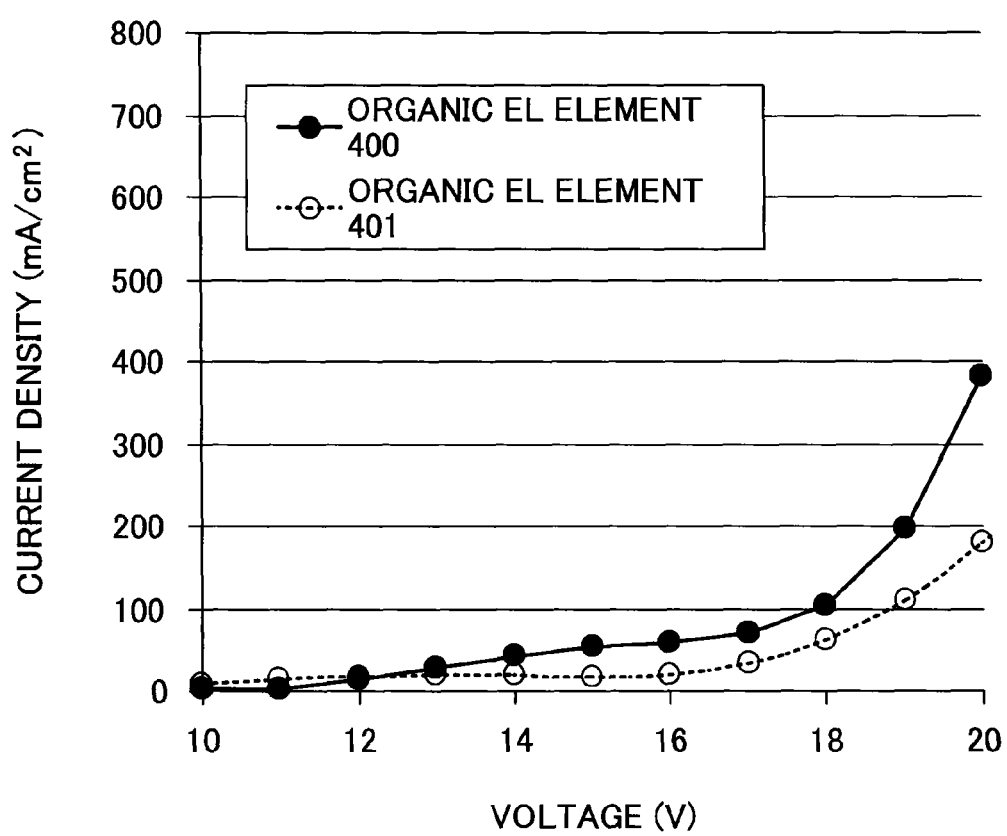
FIG. 9 is a graph illustrating light emitting characteristics evaluation results of organic electroluminescence elements 400 and 401.
Figure 10:
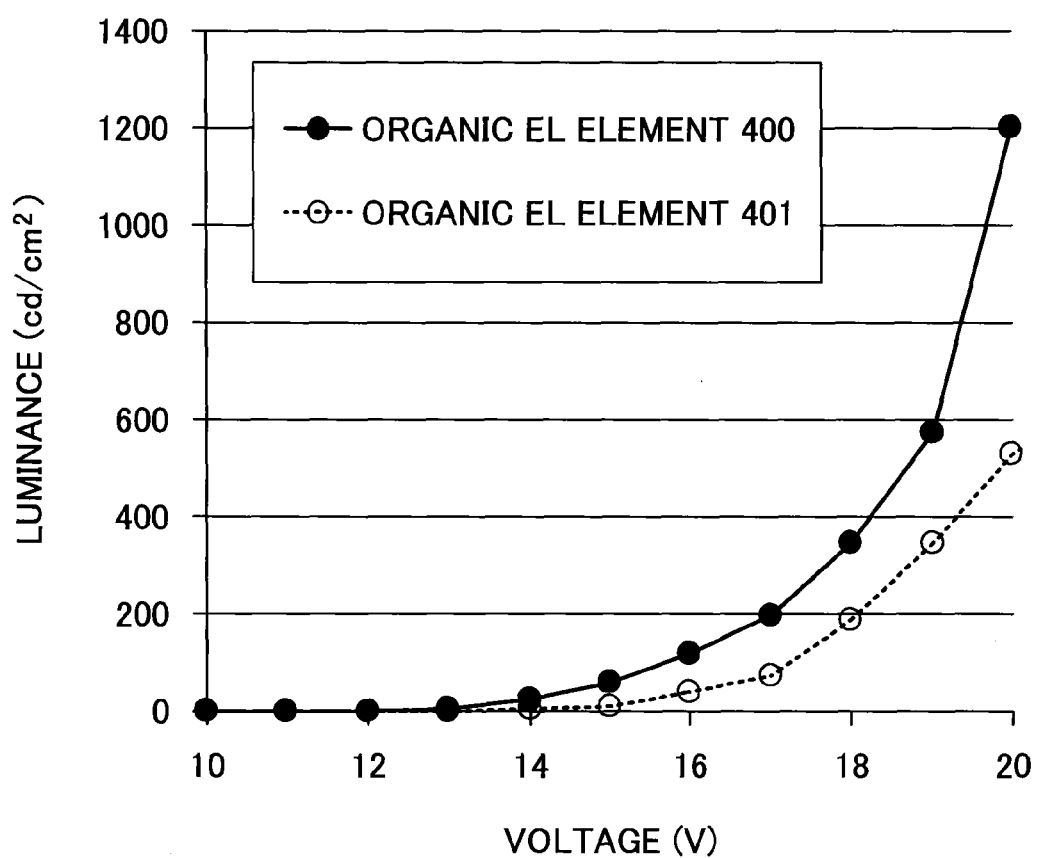
FIG. 10 is a graph illustrating light emitting characteristics evaluation results of organic electroluminescence elements 400 and 401.
Figure 11:
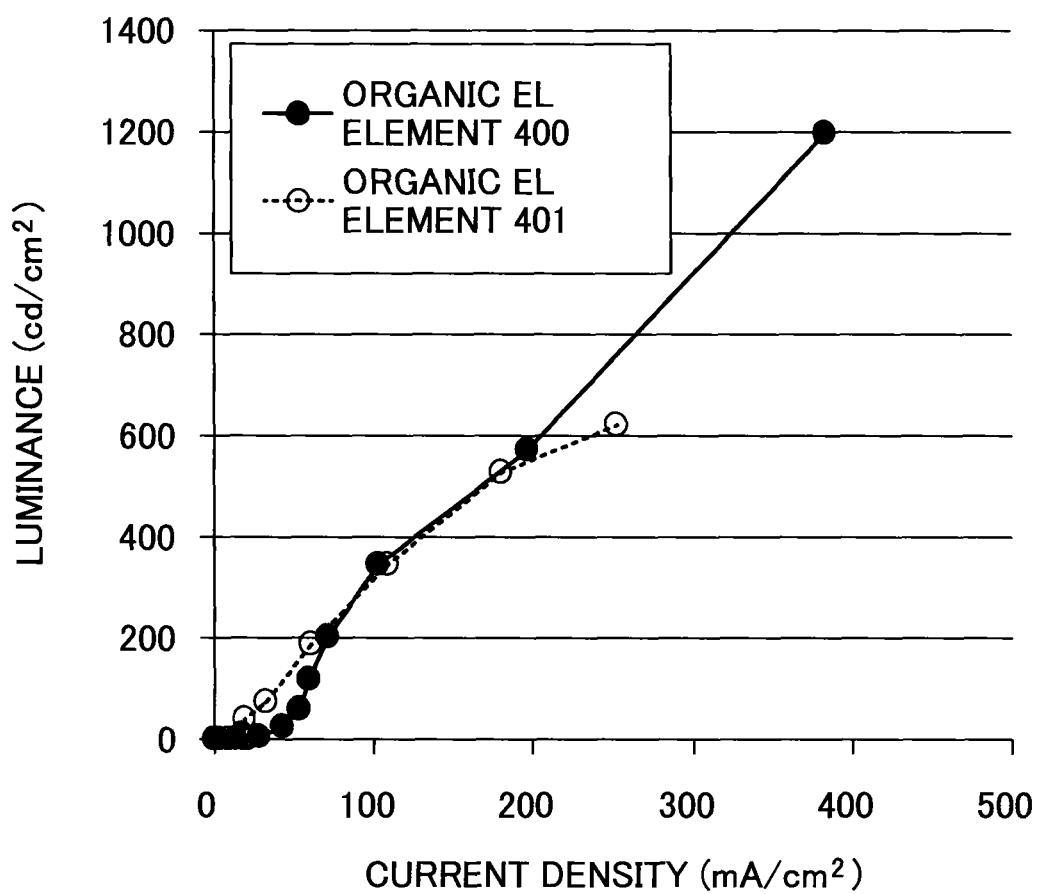
FIG. 11 is a graph illustrating light emitting characteristics evaluation results of organic electroluminescence elements 400 and 401.

FIGS. 9-11 are graphs representing the mean values of measurements obtained from six elements formed within one substrate. In FIG. 9, the horizontal axis represents the applied voltage (based on the cathode 420), and the vertical axis represents the current density generated between the cathode 420 and the anode 470. In FIG. 10, the horizontal axis represents the applied voltage (based on the cathode 420), and the vertical axis represents the luminance. In FIG. 11, the horizontal axis represents the current density generated between the cathode 420 and the anode 470, and the vertical axis represents the luminance.

It can be appreciated from FIGS. 9 and 10 that, in the organic EL element 400 having the electron injection layer 430 made of an amorphous C12A7 electride, the current density and the luminance at a given voltage are substantially higher than the current density and the luminance of the sample 401 at the same voltage.

It can be appreciated from FIG. 11 that the luminance/current density ratio of the organic EL element 400 having the electron injection layer 430 made of an amorphous C12A7 electride is substantially the same as the luminance/current density ratio of the organic EL element 401 having the electron injection layer 430 made of lithium fluoride. This indicates that the luminance increase of the organic EL element 400 at a given voltage is caused by a current density increase. This further indicates that the electron injection properties of the amorphous C12A7 electride are superior to those of lithium fluoride.

(Amorphous C12A7 Electride Characteristics Evaluation)

An amorphous C12A7 electride thin film sample was formed on a quartz substrate using sputtering conditions identical to those used to fabricate the above organic EL element 400, and the light absorption coefficient of the resulting thin film sample was measured. Note, however, that to facilitate analysis, the processing time was altered from the above fabrication conditions to increase the thickness of the amorphous C12A7 electride thin film.

The light absorption coefficient was calculated based on light transmittance and reflectance measurement results of the thin film sample. More specifically, assuming T denotes the light transmittance, R denotes the reflectance, t denotes the thickness, and A denotes the light absorption coefficient, their relationship may be represented by the following equation:

$$A = \mathrm{Ln}(T/(1-R))/t \quad (4)$$

Figure 12:
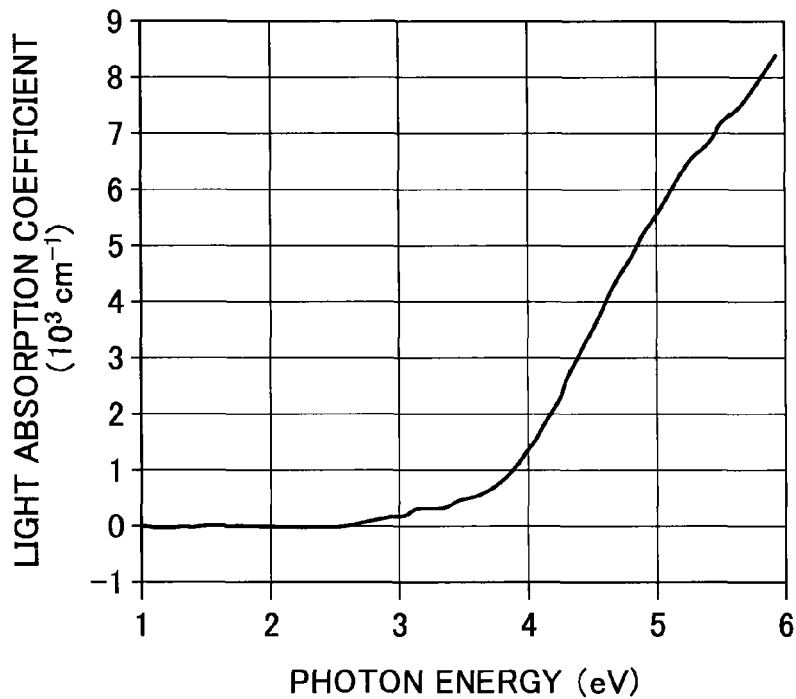
FIG. 12 is a graph illustrating the light absorption coefficient of an amorphous thin film formed by vapor deposition under a low-oxygen-partial-pressure atmosphere using a target made of a crystalline C12A7 electride.

FIG. 12 indicates the light absorption coefficient of the thin film sample. In FIG. 12, light absorption can be observed at a photon energy around 4.6 eV. As described above, bipolarons of an amorphous C12A7 electride exhibits light absorption around a photon energy of 4.6 eV. Thus, the results of FIG. 12 suggest that the thin film sample includes bipolarons. Also, the ratio of the light absorption coefficient at a photon energy position of 3.3 eV with respect to the light absorption coefficient at the photon energy position of 4.6 eV was less than or equal to 0.35.

Then, an amorphous thin film sample was formed on an ITO substrate using the same sputtering conditions as those used to fabricate the organic EL element 400, and the work function of the thins film sample was measured using ultraviolet photoelectron spectroscopy (UPS). The thickness of the amorphous C12A7 thin film sample was arranged to be 10 nm.

In order to obtain a clean surface, measurement was performed under ultra-high vacuum ($10^{-7}$ Pa), and organic matter was removed from the surface by Ar sputtering before measurement. Also, X-ray photoelectron spectroscopy was performed before and after the Ar sputtering process to confirm that the thin film sample has not been damaged. Further, a DC voltage (bias voltage) was applied to the sample so that the sample would be at negative potential with respect to the measuring device. By applying such a bias voltage, influences of surface potential can be removed.

Figure 13:
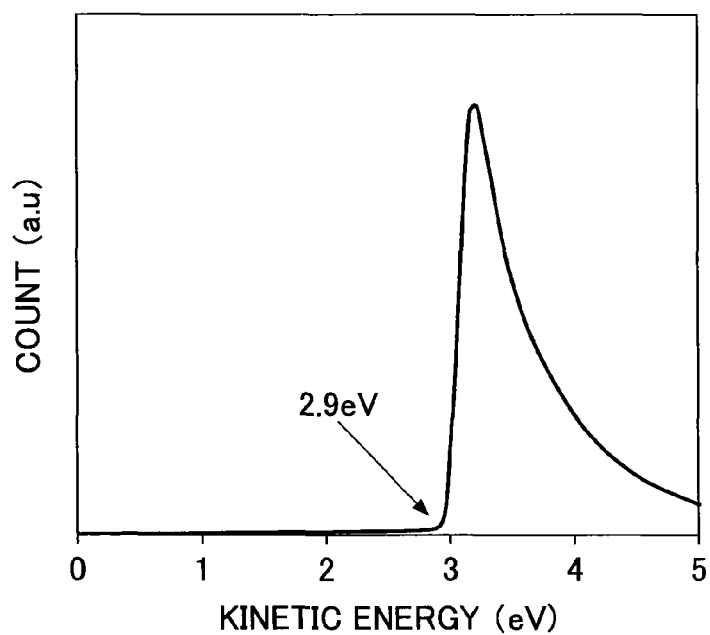
FIG. 13 is a graph illustrating a ultraviolet photoelectron spectroscopy measurement of kinetic energy spectra of photoelectrons in an amorphous thin film formed by vapor deposition under a low-oxygen-partial-pressure atmosphere using a target made of a crystalline C12A7 electride.

FIG. 13 illustrates the kinetic energy distribution of electrons that have been released from the sample that has been irradiated with ultraviolet light. In this case, even when the bias voltage is changed from 5 V to 10 V, substantially the same spectrum is obtained, and therefore, it can be appreciated that the sample is not charged up and that the spectral shape reflects the work function. Also, these results indicate that the sample has a conductivity. Based on the minimum kinetic energy of the photoelectrons in FIG. 13, the work function was determined to be approximately 2.9 eV.

Example 5

Organic EL element samples were fabricated in the following manner, and their characteristics were evaluated. The organic EL element samples fabricated in the present example were configured to include a glass substrate having a cathode arranged thereon as a bottom electrode. The organic EL element samples were further configured to have an electron injection layer, an electron transport layer/light emitting layer, a hole transport layer, and an anode as a top electrode arranged in this order on the cathode corresponding to the bottom electrode. Also, the organic EL element samples were configured to extract light from the cathode side.

(Sample Fabrication)

Organic EL elements 402 and 403 were fabricated in the following manner.

First, a 30 mm×30 mm Flat-ITO substrate manufactured by Geomatec Co, Ltd. was prepared. This substrate has a 150-nm-thick ITO film formed on an alkali-free glass substrate.

Then, a Kapton tape cut to a width of 1 mm was adhered to the ITO and then immersed in an etching solution for 2 minutes to remove the ITO from portions of the substrate not covered by the Kapton tape. The etching solution was prepared by fabricating a water solution including $FeCl_3 \cdot 6H_2O$ and ion exchanged water at a weight ratio of 1:1 and adding concentrated hydrochloric acid at the same weight as the water solution. The temperature of the etching solution was adjusted to 45° C.

Then, the Kapton tape was removed, and the substrate was subject to ultrasonic cleaning with a neutral detergent for 5 minutes, followed by ultrasonic cleaning in pure water for 5 minutes, and this cleaning process was carried out twice. Further, the substrate was subject to ultrasonic cleaning in acetone for 5 minutes, followed by ultrasonic cleaning in IPA for 5 minutes, and this cleaning process was carried out twice. Finally, the substrate was immersed in boiling IPA, and was slowly taken out.

A resulting glass substrate 410 having the 1-mm-wide ITO formed thereon as wiring (cathode 420) was then introduced into an apparatus having a sputtering film deposition chamber, a vacuum deposition chamber, and a glove box that are interconnected, and air was evacuated from the apparatus to reduce the pressure to approximately $3 \times 10^{-5}$ Pa. Then, an amorphous thin film was formed as an electron injection layer 430 on the cathode 420.

The amorphous thin film was formed by sputtering using a 2-inch-diameter crystalline C12A7 electride target having an electron density of $1.4 \times 10^{21}$ cm$^{-3}$. The sputtering process was performed under an atmosphere with an oxygen partial pressure less than approximately $4.3 \times 10^{-7}$ Pa. Ar was used as the sputtering gas, and the pressure of the introduced gas was adjusted to 0.5 Pa. The distance (TS distance) between the sample and the target was arranged to be 10 cm. Also, the output of an RF power supply was arranged to be 50 W. Note that a pre-sputtering process using Ar gas was performed prior to carrying out the present film deposition process. The glass substrate 410 was not actively heated.

The thickness of the resulting amorphous thin film was approximately 5 nm.

Then, the glass substrate 410 having the electron injection layer 430 (and the cathode 420) formed thereon was introduced into the vacuum deposition chamber of the apparatus, and an Alq3 layer was formed as an electron transport layer/light-emitting layer 440. The thickness of the Alq3 layer was arranged to be approximately 50 nm. Then, an α-NPD layer was formed as a hole transport layer 450. The thickness of the α-NPD layer was arranged to be approximately 50 nm.

Note that a metal mask was used to form the Alq3 layer and the α-NPD layer into 20 mm×20 mm regions completely covering the electron injection layer 430. The degree of vacuum during the film deposition was arranged to be approximately $8 \times 10^{-6}$ Pa.

Then, an anode 470 with a width of 1 mm was formed by vapor deposition to be orthogonal to the cathode 420. That is, a 1 mm×1 mm region where the cathode 420 and the anode 470 overlap corresponds to a region where a current flows upon voltage application. In the present example, gold was deposited to a thickness of 15 nm to form the anode 470.

By implementing the above steps, the organic EL element 402 including the glass substrate 410, the cathode 420 made of ITO, the electron injection layer 430 made of an amorphous thin film, the electron transport layer/light-emitting layer 440 made of Alq3, the hole transport layer 450 made of α-NPD, and the anode 470 made of gold was fabricated.

Next, the organic EL element 403 was fabricated as a comparative example. The organic EL element 403 is substantially identical to the organic EL element 402, except that it does not include the electron injection layer 430.

(Organic EL Element Characteristics Evaluation)

Next, the current/voltage and the luminance of the above organic EL elements 402 and 403 were measured. The measurements for each of the organic EL elements 402 and 403 were obtained by measuring the current value and the luminance upon applying a predetermined voltage between the cathode 420 and the anode 470 of the organic EL element 402 or 403 within a glove box that is purged of nitrogen. Note that the luminance meter (BM-7A) manufactured by TOPCOM was used to measure the luminance.

Figure 14:
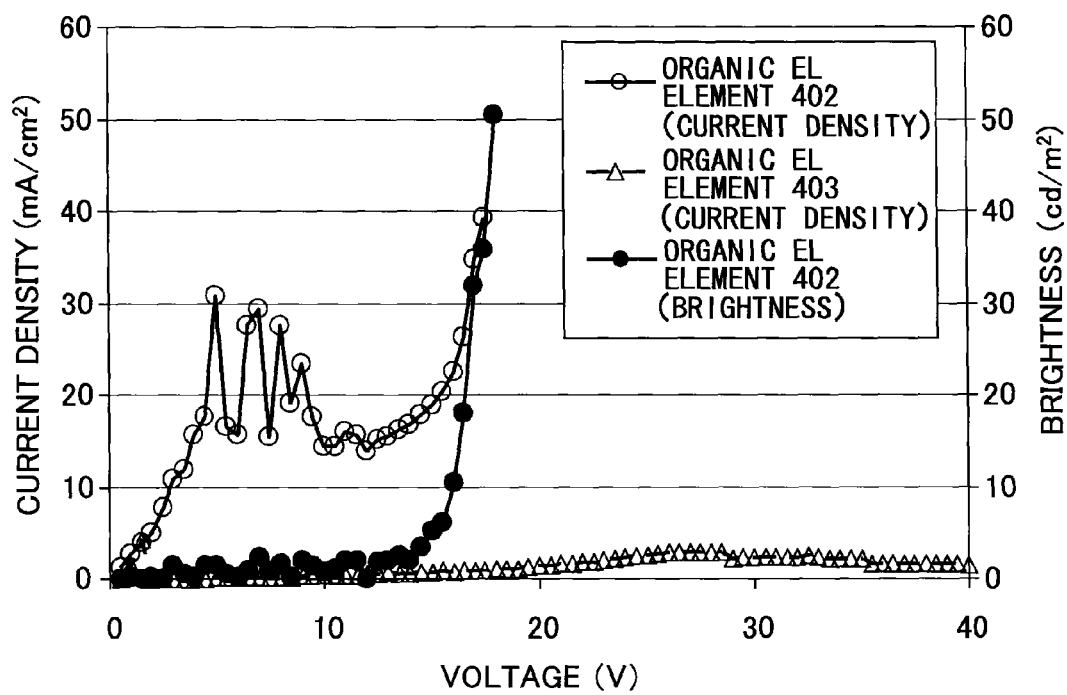
FIG. 14 is a graph illustrating light emitting characteristics evaluation results of organic electroluminescence elements 402 and 403.

FIG. 14 illustrates the measurement results of the current/voltage and the luminance of organic EL elements 402 and 403. Light emission by the organic EL element 402 having the electron injection layer 403 made of an amorphous thin film could be observed at approximately 15 V. On the other hand, with respect to the organic EL element 403 that does not include an electron injection layer, a current flow could hardly be detected, and light emission could not be observed even when 40 V was applied. Based on the above, it can be appreciated that an amorphous thin film has superior electron injection characteristics. Note that although a current flow could be detected at an applied voltage below 15 V in the organic EL element 402, the current flow was not accompanied by light emission, and as such, such current flow was likely caused by leakage.

(Amorphous Thin Film Characteristics Evaluation)

Amorphous thin film samples were formed on a quartz substrate and a nickel substrate under sputtering conditions substantially similar to those used to fabricate the above organic EL elements. Note, however, that in order to facilitate analysis, the processing time was altered from that used for fabricating the above organic EL elements, to increase the film of the amorphous thin films. The obtained samples had a film thickness of 202 nm.

Figure 15:
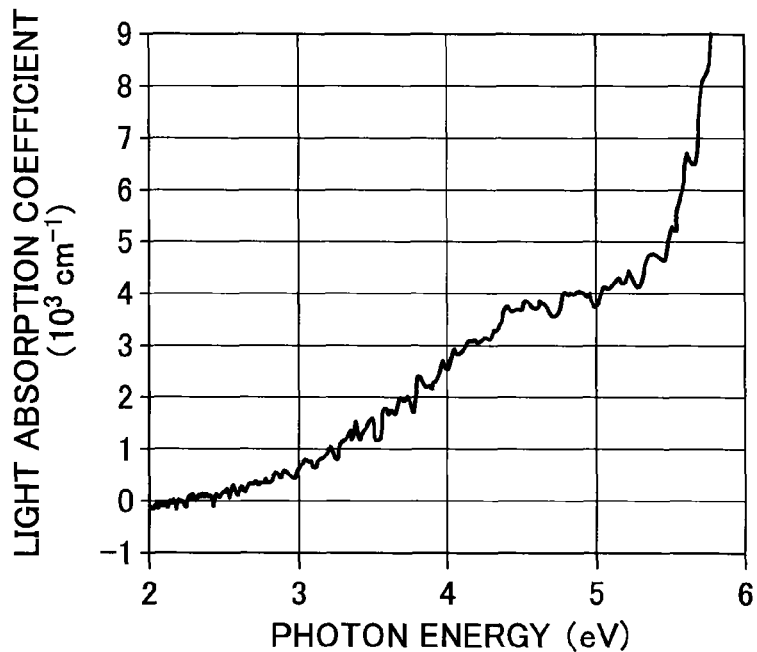
FIG. 15 is a graph illustrating the light absorption coefficient of an amorphous thin film formed by vapor deposition under a low-oxygen-partial-pressure atmosphere using a target made of a crystalline C12A7 electride.

First, with respect to the sample formed on a quartz substrate, the light absorption coefficient of the thin film sample was measured using the above equation (4). FIG. 15 illustrates the measurement results of this sample. In FIG. 15, light absorption can be observed at a photon energy of approximately 4.6 eV. As described above, bipolarons of an amorphous C12A7 electride exhibit light absorption around a photon energy of 4.6 eV. Thus, the results in FIG. 15 suggest that the thin film sample includes bipolarons. Note, also, that the ratio of the light absorption coefficient at the photon energy position of 3.3 eV with respect to the light absorption coefficient at the photon energy position of 4.6 eV was less than or equal to 0.35.

Next, with respect to the sample formed on the nickel substrate, the composition of the sample was analyzed by EPMA. Note that a carbon thin film with a thickness of 50 nm was formed on the sample surface in order to avoid charge-up of electrons from the sample surface. Also, in order to avoid the influence of the underlying nickel, the acceleration voltage was set to 5 kV. The EPMA analysis results of the thin film sample revealed that the thin film sample included Ca, Al, and O, and that the Al/Ca molar ratio was 1.76.

Example 6

Organic EL element samples were fabricated in the following manner, and their characteristics were evaluated. The organic EL element samples fabricated in the present example were configured to include a glass substrate having a cathode arranged thereon as a bottom electrode. The organic EL element samples were further configured to have an electron injection layer, an electron transport layer/light emitting layer, a hole transport layer, a hole injection layer, and an anode as a top electrode arranged in this order on the cathode corresponding to the bottom electrode. Also, the organic EL element samples were configured to extract light from the cathode side.

(Sample Fabrication)

Organic EL elements 404 and 405 were fabricated in the following manner.

First, a 30 mm×30 mm Flat-ITO substrate manufactured by Geomatec Co, Ltd. was prepared. This substrate has a 150-nm-thick ITO film formed on an alkali-free glass substrate.

Then, a Kapton tape cut to a width of 1 mm was adhered to the ITO and then immersed in an etching solution for 2 minutes to remove the ITO from portions of the substrate not covered by the Kapton tape. The etching solution was prepared by fabricating a water solution including $FeCl_3 \cdot 6H_2O$ and ion exchanged water at a weight ratio of 1:1 and adding concentrated hydrochloric acid at the same weight as the water solution. The temperature of the etching solution was adjusted to 45° C.

Then, the Kapton tape was removed, and the substrate was subject to ultrasonic cleaning with a neutral detergent for 5 minutes, followed by ultrasonic cleaning in pure water for 5 minutes, and this cleaning process was carried out twice. Further, the substrate was subject to ultrasonic cleaning in acetone for 5 minutes, followed by ultrasonic cleaning in IPA for 5 minutes, and this cleaning process was carried out twice. Finally, the substrate was immersed in boiling IPA, and was slowly taken out.

A resulting glass substrate 410 having the 1-mm-wide ITO formed thereon as wiring (cathode 420) was then introduced into an apparatus having a sputtering film deposition chamber, a vacuum deposition chamber, and a glove box that are interconnected, and air was evacuated from the apparatus to reduce the pressure to approximately $3 \times 10^{-5}$ Pa. Then, an amorphous thin film was formed as an electron injection layer 430 on the cathode 420.

The amorphous thin film was formed by sputtering using a 2-inch-diameter crystalline C12A7 electride target having an electron density of $1.4 \times 10^{21}$ cm$^{-3}$. The sputtering process was performed under an atmosphere with an oxygen partial pressure less than approximately $4.3 \times 10^{-7}$ Pa. Ar was used as the sputtering gas, and the pressure of the introduced gas was adjusted to 0.5 Pa. The distance (TS distance) between the sample and the target was arranged to be 10 cm. Also, the output of an RF power supply was arranged to be 50 W. Note that a pre-sputtering process using Ar gas was performed prior to carrying out the present film deposition process. The glass substrate 410 was not actively heated.

The thickness of the resulting amorphous thin film was approximately 5 nm.

Then, the glass substrate 410 having the electron injection layer 430 (and the cathode 420) formed thereon was introduced into the vacuum deposition chamber of the apparatus, and an Alq3 layer was formed as an electron transport layer/light-emitting layer 440. The thickness of the Alq3 layer was arranged to be approximately 50 nm. Then, an α-NPD layer was formed as a hole transport layer 450. The thickness of the α-NPD layer was arranged to be approximately 50 nm. Also, a MoO$_3$ layer was formed as a hole injection layer 460. The thickness of the MoO$_3$ layer was arranged to be approximately 0.8 nm.

Note that a metal mask was used to form the Alq3 layer, the α-NPD layer, and the MoO$_3$ layer into 20 mm×20 mm regions completely covering the electron injection layer 430. The degree of vacuum during the film deposition was arranged to be approximately $8 \times 10^{-6}$ Pa.

Then, an anode 470 with a width of 1 mm was formed by vapor deposition to be orthogonal to the cathode 420. That is, a 1 mm×1 mm region where the cathode 420 and the anode 470 overlap corresponds to a region where a current flows upon voltage application. In the present example, silver was deposited to a thickness of 80 nm to form the anode 470.

By implementing the above steps, the organic EL element 404 including the glass substrate 410, the cathode 420 made of ITO, the electron injection layer 430 made of an amorphous thin film, the electron transport layer/light-emitting layer 440 made of Alq3, the hole transport layer 450 made of α-NPD, the hole injection layer 460 made of MoO$_3$, and the anode 470 made of silver was fabricated.

Next, the organic EL element 405 was fabricated as a comparative example. The organic EL element 405 is substantially identical to the organic EL element 404, except that it does not include the electron injection layer 430.

(Organic EL Element Characteristics Evaluation)

Next, the voltage and the luminance of the above organic EL elements 404 and 405 were measured. The measurements were conducted by determining the luminance obtained upon applying a predetermined voltage between the cathode 420 and the anode 470 of the organic EL element 404 or 405 within a glove box that is purged of nitrogen. Note that the luminance meter (BM-7A) manufactured by TOPCOM was used to measure the luminance.

Figure 16:
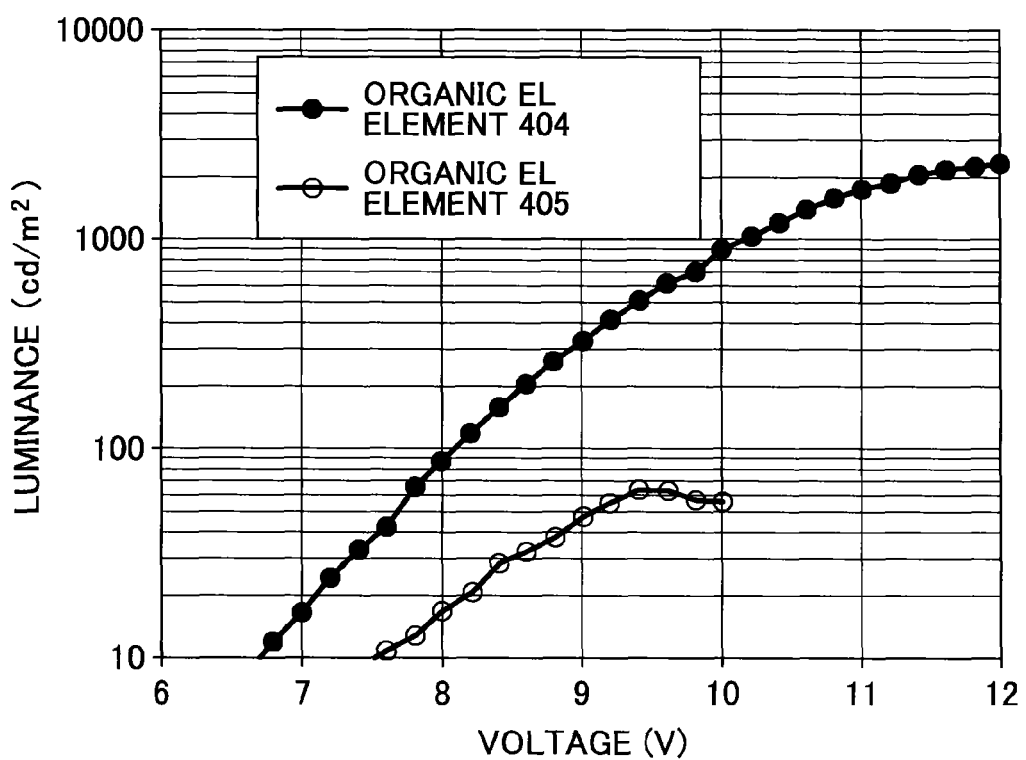
FIG. 16 is a graph illustrating light emitting characteristics evaluation results of organic electroluminescence elements 404 and 405.

FIG. 16 illustrates the measurement results of the voltage and the luminance of organic EL elements 404 and 405. Light emission by the organic EL element 404 having the electron injection layer 403 made of an amorphous thin film could be observed at approximately 6.8 V or greater, and light emission at 2000 cd/m$^2$ was observed at approximately 12 V. On the other hand, with respect to the organic EL element 405 that does not include an electron injection layer, light emission was observed at approximately 7.5 V or greater, and light emission at 60 cd/m$^2$ was observed at approximately 9.4 V. Because the difference between the organic EL elements 404 and 405 lies in the presence/absence of the electron injection layer, it could be confirmed that by including the electron injection layer, electron injection into Alq3 may be increased and light emission characteristics may be improved.

Example 7

Organic EL element samples were fabricated in the following manner, and their characteristics were evaluated. The organic EL element samples fabricated in the present example were configured to include a glass substrate having a cathode arranged thereon as a bottom electrode. The organic EL element samples were further configured to have an electron injection layer, an electron transport layer/light emitting layer, a hole transport layer, a hole injection layer, and an anode as a top electrode arranged in this order on the cathode corresponding to the bottom electrode. Also, the organic EL element samples were configured to extract light from the anode side.

(Sample Fabrication)

Organic EL elements 406 and 407 were fabricated in the following manner.

First, a 30 mm×30 mm×0.7 mm alkali-free glass substrate was prepared. The substrate was subject to ultrasonic cleaning with a neutral detergent for 5 minutes, followed by ultrasonic cleaning in pure water for 5 minutes, and this cleaning process was carried out twice. Further, the substrate was subject to ultrasonic cleaning in acetone for 5 minutes, followed by ultrasonic cleaning in IPA for 5 minutes, and this cleaning process was carried out twice. Finally, the substrate was immersed in boiling IPA, and was slowly taken out.

A resulting glass substrate 410 that has undergone the above cleaning processes was introduced into a an apparatus having a sputtering film deposition chamber, a vacuum deposition chamber, and a glove box that are interconnected, and air was evacuated from the apparatus to reduce the pressure to approximately 3×10$^{-5}$ Pa. Then, the glass substrate 410 was introduced into the vapor deposition chamber of the apparatus.

Then, a metal mask was used to form a 1-mm-wide aluminum film with a thickness of 80 nm as a cathode 420 on the glass substrate 410 by vacuum vapor deposition.

Then, the glass substrate 410 having the cathode 420 formed thereon was introduced into the sputtering film deposition chamber, and an amorphous thin film was formed on the cathode 420 as the electron injection layer 430.

The amorphous thin film was formed by sputtering using a 2-inch-diameter crystalline C12A7 electride target having an electron density of 1.4×10$^{21}$ cm$^{-3}$. The sputtering process was performed under an atmosphere with an oxygen partial pressure less than approximately 4.3×10$^{-7}$ Pa. Ar was used as the sputtering gas, and the pressure of the introduced gas was adjusted to 0.5 Pa. The distance (TS distance) between the sample and the target was arranged to be 10 cm. Also, the output of an RF power supply was arranged to be 50 W. Note that a pre-sputtering process using Ar gas was performed prior to carrying out the present film deposition process. The glass substrate 410 was not actively heated.

The thickness of the resulting amorphous thin film was approximately 2 nm.

Then, the glass substrate 410 having the electron injection layer 430 (and the cathode 420) formed thereon was introduced into the vacuum deposition chamber of the apparatus, and an Alq3 layer was formed as an electron transport layer/light-emitting layer 440. The thickness of the Alq3 layer was arranged to be approximately 50 nm. Then, an α-NPD layer was formed as a hole transport layer 450. The thickness of the α-NPD layer was arranged to be approximately 50 nm. Also, a MoO$_3$ layer was formed as a hole injection layer 460. The thickness of the MoO$_3$ layer was arranged to be approximately 0.8 nm.

Note that a metal mask was used to form the Alq3 layer, the α-NPD layer, and the MoO$_3$ layer into 20 mm×20 mm regions completely covering the electron injection layer 430. The degree of vacuum during the film deposition was arranged to be approximately 8×10$^{-6}$ Pa.

Then, an anode 470 with a width of 1 mm was formed by vapor deposition to be orthogonal to the cathode 420. That is, a 1 mm×1 mm region where the cathode 420 and the anode 470 overlap corresponds to a region where a current flows upon voltage application. In the present example, gold was deposited to a thickness of 5 nm to form the anode 470.

By implementing the above steps, the organic EL element 406 including the glass substrate 410, the cathode 420 made of aluminum, the electron injection layer 430 made of an amorphous thin film, the electron transport layer/light-emitting layer 440 made of Alq3, the hole transport layer 450 made of α-NPD, the hole injection layer 460 made of MoO$_3$, and the anode 470 made of gold was fabricated.

Next, the organic EL element 407 was fabricated as a comparative example. The organic EL element 407 is substantially identical to the organic EL element 406, except that it includes an electron injection layer made of LiF (lithium fluoride). The electron injection layer made of LiF was formed by vapor deposition and was arranged to have a thickness of 0.5 nm.

(Organic EL Element Characteristics Evaluation)

Next, the voltage and the luminance of the above organic EL elements 406 and 407 were measured. The measurements were conducted by determining the luminance obtained upon applying a predetermined voltage between the cathode 420 and the anode 470 of the organic EL element 406 or 407 within a glove box that is purged of nitrogen. Note that the luminance meter (BM-7A) manufactured by TOPCOM was used to measure the luminance.

Figure 17:
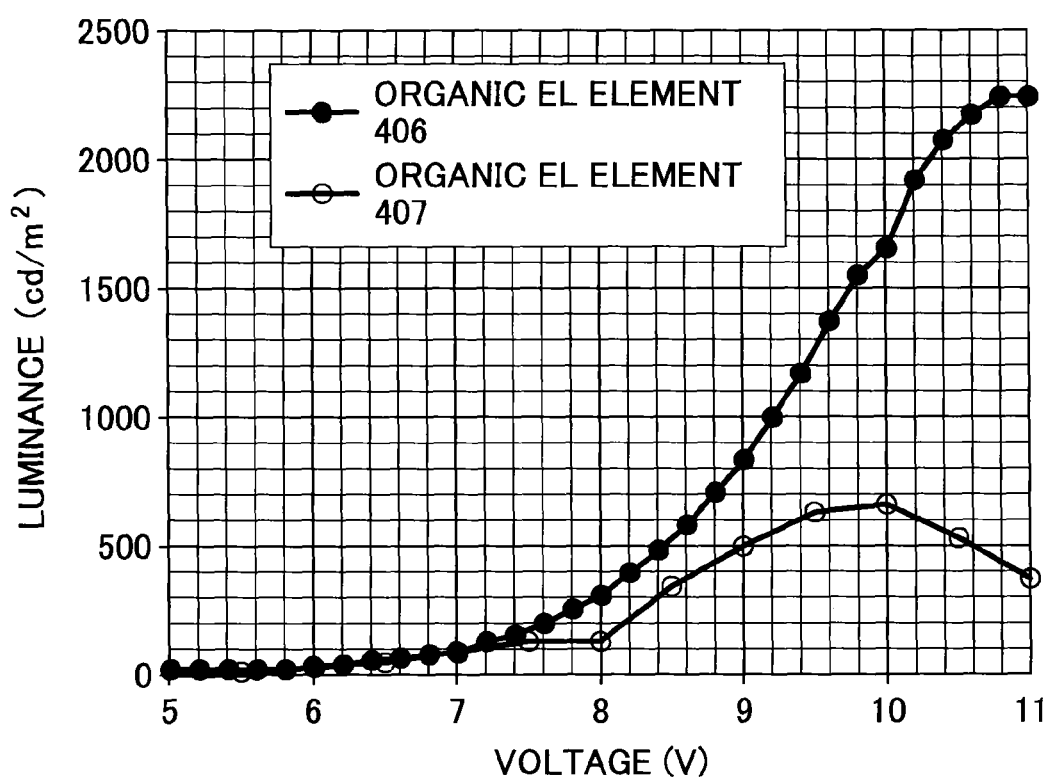
FIG. 17 is a graph illustrating light emitting characteristics evaluation results of organic electroluminescence elements 406 and 407.

FIG. 17 illustrates the measurement results of the voltage and the luminance of organic EL elements 406 and 407. In the organic EL element 406 having the electron injection layer 403 made of an amorphous thin film, light emission at 1600 cd/m$^2$ could be observed at approximately 10 V. On the other hand, in the organic EL element 407 that includes an electron injection layer made of LiF, light emission at 600 cd/m$^2$ could be observed at approximately 10 V. Because the difference between the organic EL elements 406 and 407 lies in the electron injection layer, it could be confirmed that by using an amorphous thin film as the electron injection layer, electron injection into Alq3 may be increased and light emission characteristics may be improved.

Example 8

An organic EL element 408 was fabricated in the following manner, and its characteristics were evaluated. The organic EL element 408 fabricated in the present example was configured to include a glass substrate having a cathode arranged thereon as a bottom electrode. The organic EL element 408 was further configured to have an electron injection layer, an electron transport layer, a light emitting layer, a hole transport layer, a hole injection layer, and an anode as a top electrode arranged in this order on the cathode corresponding to the bottom electrode. Also, the organic EL element 408 was configured to extract light from the anode side. Note that in the above Example 7, an Alq3 layer having a thickness of 50 nm was used as an electron transport layer/light emitting layer. On the other hand, in the present example, a ZnO—$SiO_2$ layer having a thickness of 100 nm was used as an electron transport layer, and an Alq3 layer having a thickness of 30 nm was used as a light emitting layer. Other layers of the organic EL element 408 were arranged to be identical to those fabricated in Example 7.

That is, a cathode and an electron injection layer made of an amorphous thin film were formed on a glass substrate in a manner similar to Example 7.

Then, the target was changed to ZnO—$SiO_2$, and a ZnO—$SiO_2$ thin film with a thickness of approximately 100 nm was formed as an electron transport layer on the electron injection layer.

Then, the glass substrate having the above layers formed thereon was introduced into the vacuum deposition of the apparatus, and an Alq3 layer was formed as a light emitting layer. The thickness of the Alq3 layer was arranged to be approximately 30 nm.

Then, an α-NPD layer was formed as a hole transport layer. The thickness of the α-NPD layer was arranged to be approximately 50 nm.

Further, a $MoO_3$ layer was formed as a hole injection layer. The thickness of the $MoO_3$ layer was arranged to be approximately 0.8 nm.

Note that a metal mask was used to form the Alq3 layer, the α-NPD layer, and the $MoO_3$ layer into 20 mm×20 mm regions completely covering the electron injection layer. The degree of vacuum during the film deposition was arranged to be approximately $8 \times 10^{-6}$ Pa.

Then, a 1-mm-wide anode was formed by vapor deposition to be orthogonal to the cathode. That is, a 1 mm×1 mm region where the cathode and the anode overlap corresponds to a region where a current flows upon voltage application. In the present example, gold was deposited to a thickness of 5 nm to form the anode.

By implementing the above steps, the organic EL element 408 including the glass substrate, the cathode made of aluminum, the electron injection layer made of an amorphous thin film, the electron transport layer made of ZnO—$SiO_2$, the light-emitting layer made of Alq3, the hole transport layer made of α-NPD, the hole injection layer made of $MoO_3$, and the anode made of gold was fabricated.

(Organic EL Element Characteristics Evaluation)

Next, a DC voltage was applied to the above organic EL element 408 to measure the current and the luminance of the organic EL element 408. The measurements were conducted by determining the luminance and the current upon applying a predetermined voltage between the cathode and the anode of the organic EL element 408 within a glove box that is purged of nitrogen. Note that the luminance meter (BM-7A) manufactured by TOPCOM was used to measure the luminance. It could be confirmed that in the organic EL element 408 using ZnO—$SiO_2$ as the electron transport layer, the luminance per unit current of is higher than an organic El element using Alq3 as the electron transport layer; that is, the current efficiency (cd/A) may be improved.

INDUSTRIAL APPLICABILITY

Embodiments of the present invention can be applied to an organic electroluminescence element and the like. An organic electroluminescent element according to an embodiment of the present invention may have a tandem structure having a plurality of light emitting layers stacked and connected by an intermediate layer, for example.

An organic electroluminescent element according to an embodiment of the present invention can be used as a display element of a display device, for example. A display device having an organic electroluminescence device according to an embodiment of the present invention can be applied to a variety of electronic devices including, a display device such as a television receiver, an imaging device such as a digital camera, a digital information processing device such as a computer, a display unit of a portable terminal device such as a cellular phone, for example. Also, a display device having an organic electroluminescence device according to an embodiment of the present invention may be incorporated in a display unit of a vehicle, or a display unit of a car navigation system, for example.

Also, a display device having an organic electroluminescence device according to an embodiment of the present invention can also be arranged at a window, a door, a ceiling, a floor, a wall, or a partition member of a building structure or a mobile object (vehicle, aircraft, ship, etc.), for example. Also, a display device having an organic electroluminescence device according to an embodiment of the present invention can implemented as an advertising display device in a public transportation vehicle, a billboard, or a poster column, for example.

Also, an organic electroluminescent element according to an embodiment of the present invention may be used as a light source of a lighting device or a light source of a display device, for example.

Further, the present invention is not limited to the embodiments described above, but various variations and modifications may be made without departing from the scope of the present invention.

What is claimed is:

1. A light emitting device comprising an organic electroluminescence element, wherein
   the light emitting device is a display device or a lighting device;
   the organic electroluminescence element comprises an anode, a light emitting layer, and a cathode that are arranged in this order;
   an electron injection layer is arranged between the light emitting layer and the cathode; and
   the electron injection layer is made of an amorphous C12A7 electride, wherein the amorphous C12A7 electride comprises a cage containing an electron.

2. The light emitting device of claim 1, wherein
   an electron transport layer is arranged between the light emitting layer and the electron injection layer; and
   the electron transport layer is made of a metal oxide material.

3. The light emitting device of claim 2, wherein the electron transport layer is in an amorphous phase, a crystalline phase, or an amorphous-crystalline mixed phase.

4. The light emitting device of claim 2, wherein the electron transport layer is made of ZnO—$SiO_2$, $In_2O_3$—$SiO_2$, $SnO_2$—$SiO_2$, ZnO, In—Ga—Zn—O, In—Zn—O, or $SnO_2$.

5. The light emitting device of claim 1, wherein an electron density of the amorphous C12A7 electride is within a range of $1 \times 10^{19}$ cm$^{-3}$ to $2.3 \times 10^{21}$ cm$^{-3}$.

6. The light emitting device of claim 1, wherein an electron density of the amorphous C12A7 electride is within a range of $1 \times 10^{20}$ cm$^{-3}$ to $2.3 \times 10^{21}$ cm$^{-3}$.

7. The light emitting device of claim 1, wherein an electron density of the amorphous C12A7 electride is less than or equal to $2.3 \times 10^{21}$ cm$^{-3}$.

8. The light emitting device of claim 1, wherein an electron density of the amorphous C12A7 electride is within a range of $2.0 \times 10^{18}$ cm$^{-3}$ to $2.3 \times 10^{21}$ cm$^{-3}$.

9. The light emitting device of claim 1, wherein a direct current conductivity at room temperature of the amorphous C12A7 electride is within a range of $10^{-9}$ S·cm$^{-1}$ to $10^{-1}$ S·cm$^{-1}$.

10. The light emitting device of claim 1, wherein a direct current conductivity at room temperature of the amorphous C12A7 electride is within a range of $10^{-7}$ S·cm$^{-1}$ to $10^{-3}$ S·cm$^{-1}$.

11. A light emitting device comprising an organic electroluminescence element, wherein
- the light emitting device is a display device or a lighting device;
- the organic electroluminescence element comprises an anode, a light emitting layer, and a cathode that are arranged in this order;
- an electron injection layer is arranged between the light emitting layer and the cathode; and
- the electron injection layer is made of an electride of an amorphous solid material comprising calcium, aluminum, and oxygen, wherein the electride comprises a cage containing an electron.

\* \* \* \* \*